(12) United States Patent
Cheng et al.

(10) Patent No.: US 10,850,462 B2
(45) Date of Patent: Dec. 1, 2020

(54) OPTICAL ELEMENTS AND METHOD FOR FABRICATING THE SAME

(71) Applicant: VisEra Technologies Company Limited, Hsin-Chu (TW)

(72) Inventors: Sheng-Chuan Cheng, Hsin-Chu (TW); Hao-Min Chen, Chiayi (TW); Chi-Han Lin, Zhubei (TW); Han-Lin Wu, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 150 days.

(21) Appl. No.: 16/150,804

(22) Filed: Oct. 3, 2018

(65) Prior Publication Data

US 2020/0108573 A1 Apr. 9, 2020

(51) Int. Cl.
| | | |
|---|---|---|
| *G02B 3/00* | (2006.01) | |
| *G02B 9/00* | (2006.01) | |
| *B29D 11/00* | (2006.01) | |
| *G02B 27/09* | (2006.01) | |

(Continued)

(52) U.S. Cl.
CPC ...... *B29D 11/00355* (2013.01); *G02B 27/095* (2013.01); *H01L 21/0271* (2013.01); *H01L 51/0017* (2013.01)

(58) Field of Classification Search
CPC  G02B 3/0087; G02B 3/0012; G02B 27/0025; G02B 1/041; G02B 6/32; G02B 1/007; G02B 1/002; H01L 27/14627; H01L 27/14625; H01L 27/14685; H01L 2924/00;

(Continued)

(56) References Cited

U.S. PATENT DOCUMENTS 8,263,194 B2  9/2012  Chen et al.
2010/0244169 A1*  9/2010  Maeda ............ H01L 27/14685
257/432

(Continued)

FOREIGN PATENT DOCUMENTS

CN  102713693 A  10/2012
CN  105765421 A  7/2016

(Continued)

*Primary Examiner* — William R Alexander
*Assistant Examiner* — Tamara Y. Washington
(74) *Attorney, Agent, or Firm* — Muncy, Geissler, Olds & Lowe, P.C.

(57) ABSTRACT

A method for fabricating an optical element is provided. A substrate is provided. A plurality of metal grids are formed on the substrate. An organic layer is formed on the substrate and the metal grids. The organic layer is etched to form a first patterned organic layer including a plurality of first protrusion portions and a plurality of first trenches surrounded by the first protrusion portions. The first patterned organic layer is etched to form a second patterned organic layer including a plurality of second protrusion portions and a plurality of second trenches surrounded by the second protrusion portions. Each second protrusion portion covers one metal grid. There is a distance between the center axis of one second protrusion portion of the second patterned organic layer and the center axis of one metal grid covered by the one second protrusion portion of the second patterned organic layer.

20 Claims, 19 Drawing Sheets

(51) Int. Cl.
*H01L 51/00* (2006.01)
*H01L 21/027* (2006.01)

(58) Field of Classification Search
CPC ........ B29D 11/00355; B29D 11/00009; B29D 11/00298; B29D 11/00432; B29D 11/0073
USPC .......................................................... 359/652
See application file for complete search history.

(56) References Cited

U.S. PATENT DOCUMENTS

| | | | | |
|---|---|---|---|---|
| 2010/0282945 | A1* | 11/2010 | Yokogawa | ........ H01L 27/14625 250/208.1 |
| 2011/0096560 | A1* | 4/2011 | Ryu | ................... C09K 11/7734 362/510 |
| 2011/0260192 | A1* | 10/2011 | Kwak | ..................... H01L 33/56 257/98 |
| 2015/0270298 | A1* | 9/2015 | Lin | ................... H01L 27/14621 257/432 |

FOREIGN PATENT DOCUMENTS

| | | | |
|---|---|---|---|
| JP | H09321046 | A | 12/1997 |
| JP | 2003298034 | A | 10/2003 |
| JP | 2008235938 | A | 10/2008 |
| JP | 2013038383 | A * | 2/2013 |
| JP | 2013038383 | A | 2/2013 |
| JP | 2015130442 | A | 7/2015 |
| WO | WO2012/077675 | A1 | 6/2012 |

* cited by examiner

OPTICAL ELEMENTS AND METHOD FOR FABRICATING THE SAME

BACKGROUND OF THE INVENTION

Field of the Invention

The invention relates to a fabrication method of an optical element, and more particularly to a fabrication method of an optical element using a wave-guiding process accompanied by shifting of dual grids, and an optical element fabricated thereby.

Description of the Related Art

In an optical element, in order to receive incident light from a variety of angles, the shifting of the dual grids (e.g., a low-n grid and a metal grid) disposed in edge pixels is required to ensure that the optical performance, such as SNR10, of the edge pixels can be maintained. However, in a conventional process for fabricating a wave-guiding structure with dual grid shifting, after metal grids are formed on a substrate, a guiding film is coated over the metal grids and the substrate. A mask layer is then formed on the guiding film. An etching process is performed on the guiding film until the substrate is exposed. Since the metal grids are exposed from the guiding film, lack of proper protection, during the etching process, the metal grids are often damaged during the etching process.

Therefore, development of a fabrication method of an optical element which is capable of improving optical performance of edge pixels and preventing damage to the metal grid during the etching process is desirable.

BRIEF SUMMARY OF THE INVENTION

In accordance with one embodiment of the invention, a method for fabricating an optical element is provided. The fabrication method includes the following steps. A substrate is provided. A plurality of metal grids are formed on the substrate. An organic layer is formed on the substrate and the metal grids. The organic layer is etched to form a first patterned organic layer including a plurality of first protrusion portions and a plurality of first trenches surrounded by the first protrusion portions. The first patterned organic layer is etched to form a second patterned organic layer including a plurality of second protrusion portions and a plurality of second trenches surrounded by the second protrusion portions. Each second protrusion portion covers one metal grid. There is a distance between the center axis of one second protrusion portion of the second patterned organic layer and the center axis of one metal grid covered by the one second protrusion portion of the second patterned organic layer.

In some embodiments, the bottom of each first trench is over the top surface of each metal grid.

In some embodiments, the bottom of each first trench is under the top surface of each metal grid.

In some embodiments, the step of etching the first patterned organic layer to form the second patterned organic layer uses a mask layer which is disposed on a part of the top surface of each first protrusion portion of the first patterned organic layer as a mask.

In some embodiments, the step of etching the first patterned organic layer to form the second patterned organic layer uses a mask layer which is disposed on the top surface and a part of the sidewalls of each first protrusion portion of the first patterned organic layer as a mask.

In some embodiments, the step of etching the first patterned organic layer to form the second patterned organic layer further includes forming a plurality of extension portions covering the metal grids and connecting to adjacent second protrusion portions of the second patterned organic layer.

In some embodiments, the step of etching the first patterned organic layer to form the second patterned organic layer uses a mask layer which is disposed on a part of the top surface of each first protrusion portion of the first patterned organic layer and filled into the plurality of first trenches as a mask.

In some embodiments, the organic layer has a refractive index which is in a range from about 1.2 to about 1.45.

In some embodiments, the organic layer includes a first portion having a refractive index from about 1.4 to about 1.55 and a second portion having a refractive index from about 1.2 to about 1.45, the second portion being above the first portion, and the first portion covering the top surface of each metal grid.

In some embodiments, the step of etching the organic layer to form the first patterned organic layer includes etching the second portion of the organic layer to form the first patterned organic layer including the plurality of first protrusion portions and the first portion of the organic layer, wherein the plurality of first trenches are surrounded by the first protrusion portions, and the bottom of each first trench is over the top surface of each metal grid.

In some embodiments, the step of etching the first patterned organic layer to form the second patterned organic layer includes etching the first portion of the organic layer to form the plurality of second protrusion portions and the plurality of second trenches surrounded by the second protrusion portions.

In some embodiments, the step of etching the first patterned organic layer to form the second patterned organic layer uses a mask layer which is disposed on the top surface of each first protrusion portion of the first patterned organic layer as a mask.

In some embodiments, the step of etching the first patterned organic layer to form the second patterned organic layer uses a mask layer which is disposed on the top surface and a part of the sidewalls of each first protrusion portion of the first patterned organic layer as a mask.

In some embodiments, after the step of etching the first patterned organic layer to form the second patterned organic layer, a part of the first portion of the organic layer is left between each second protrusion portion and each metal grid.

In some embodiments, the step of etching the organic layer to form the first patterned organic layer uses haloalkyl gas as an etching gas.

In some embodiments, the step of etching the first patterned organic layer to form the second patterned organic layer uses haloalkyl gas, oxygen, carbon dioxide or nitrogen as an etching gas.

In some embodiments, the present method further includes filling color filters into the second trenches.

In accordance with one embodiment of the invention, an optical element is provided. The optical element includes a substrate, a plurality of metal grids and an organic layer. The substrate includes a center region, a middle region and an edge region. The middle region is located between the center region and the edge region. The metal grids are formed on the substrate located within the center region, the middle region and the edge region, respectively. The organic layer is formed on the substrate and the metal grids. The organic layer within the center region includes a plurality of protrusion portions and a plurality of extension portions. Each extension portion is connected to adjacent protrusion portions. Within the center region, each metal grid is covered by one protrusion portion of the organic layer, and there is no distance between the center axis of one protrusion portion of the organic layer and the center axis of one metal grid covered by the one protrusion portion of the organic layer. The organic layer within the middle region includes a plurality of protrusion portions and a plurality of extension portions. Each extension portion is connected to adjacent protrusion portions. Within the middle region, each metal grid is simultaneously covered by one protrusion portion and one extension portion of the organic layer, and there is a distance between the center axis of one protrusion portion of the organic layer and the center axis of one metal grid covered by the one protrusion portion of the organic layer. The organic layer within the edge region includes a plurality of protrusion portions and a plurality of extension portions. Each extension portion is connected to adjacent protrusion portions. Within the edge region, each metal grid is simultaneously covered by one protrusion portion and one extension portion of the organic layer, and there is a distance between the center axis of one protrusion portion of the organic layer and the center axis of one metal grid covered by the one protrusion portion of the organic layer. The distance between the center axis of one protrusion portion of the organic layer and the center axis of one metal grid covered by the one protrusion portion of the organic layer within the edge region is greater than that within the middle region.

In some embodiments, the organic layer has a refractive index which is in a range from about 1.2 to about 1.45, and each extension portion of the organic layer has a thickness which is in a range from about 0.05 μm to about 0.2 μm.

In some embodiments, the distance between the center axis of one protrusion portion of the organic layer and the center axis of one metal grid covered by the one protrusion portion of the organic layer is at least half of the width of the one metal grid within the edge region.

In the present invention, it is not required that a microlens (ML) structure be disposed over color filters. Light is conducted into photodiode (PD) areas through a wave-guiding element which is fabricated on metal grids. The present invention provides a two-stage etching process for fabricating a wave-guiding structure with dual grid (e.g., a low-refractive-index grid and a metal grid) shifting. An organic layer which is formed over the metal grids is etched by a first etching process to form a patterned organic layer. After the first etching process, the patterned organic layer still completely covers the metal grids to protect the metal grids from being damaged in a subsequent etching process. Various patterned mask layers with specific designs (e.g., size and location) and a combination thereof are then formed on the patterned organic layer. After a second etching process is performed, a wave-guiding structure with the dual grid shifting is thus obtained by properly controlling the etching time and the metal grids will not be damaged during the entire etching processes. Also, the organic layer remains on the substrate and the metal grids. In addition, the shifting distance between the dual grids is gradually increased from a center region to an edge region of the substrate to meet the requirements (such as receiving light with a specific incidence angle) of the related products.

The present invention also provides a method for fabricating a wave-guiding structure with the dual grid shifting in which adopts two organic layers. A first organic layer (refractive index: about 1.4 to about 1.55) is first formed on the metal grids. The first organic layer is used as a protection layer of the metal grids for a subsequent etching process. A second organic layer (refractive index: about 1.2 to about 1.45) is then formed on the first organic layer. The second organic layer is used to form the wave-guiding element. When a first etching process is performed using, for example, haloalkyl gas as an etching gas, the second organic layer is etched until the first organic layer is exposed. After the first etching process, the metal grids are still covered by the first organic layer without being exposed therefrom. The first organic layer is then removed by a second etching process using, for example, oxygen (i.e. a gas that will not damage the metal grid) as an etching gas. Using such a technique can effectively prevent damage to the metal grids during the etching process.

In addition, in some embodiments, although a part of the organic layer remains on the substrate, the thickness of the color filters can maintain the same height when the color filters are filled into the trenches surrounded by the organic layer, without affecting the optical performance, for example the QE profile.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
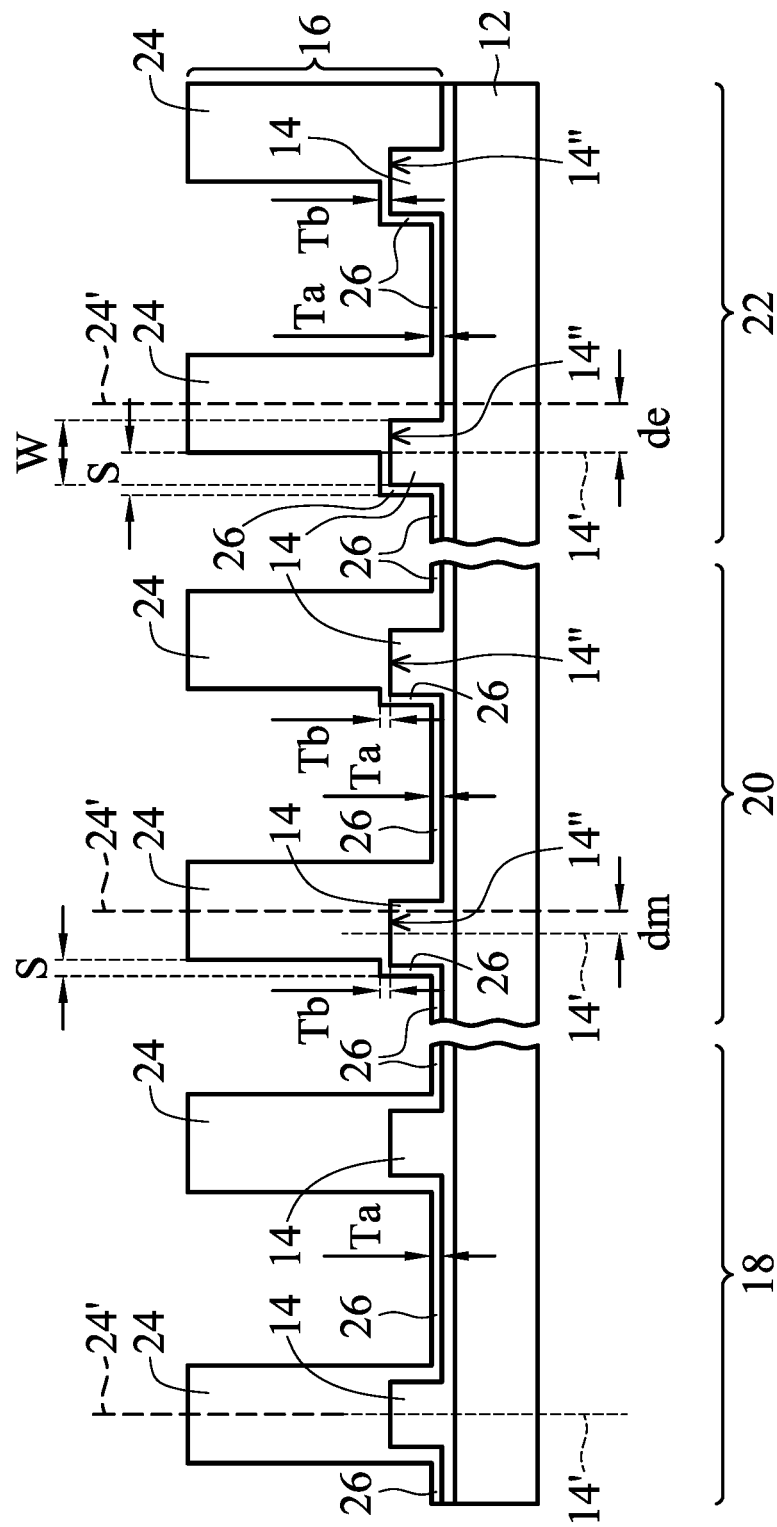
FIG. 1 is a cross-sectional view of an optical element in accordance with one embodiment of the invention.

Referring to FIG. 1, in accordance with one embodiment of the invention, an optical element 10 is provided. FIG. 1 shows a cross-sectional view of the optical element 10.

The optical element 10 includes a substrate 12, a plurality of metal grids 14 and an organic layer 16. The substrate 12 includes a center region 18, a middle region 20 and an edge region 22. The middle region 20 is located between the center region 18 and the edge region 22. The metal grids 14 are formed on the substrate 12, which are located within the center region 18, the middle region 20 and the edge region 22, respectively. The organic layer 16 is formed on the substrate 12 and the metal grids 14.

The organic layer 16 within the center region 18 includes a plurality of protrusion portions 24 and a plurality of extension portions 26. Each extension portion 26 is connected to adjacent protrusion portions 24. Within the center region 18, each metal grid 14 is covered by one protrusion portion 24 of the organic layer 16. There is no distance between the center axis 24' of one protrusion portion 24 of the organic layer 16 and the center axis 14' of one metal grid 14 covered by the one protrusion portion 24 of the organic layer 16. That is, the protrusion portions 24 of the organic layer 16 are not shifted from the metal grids 14.

The organic layer 16 within the middle region 20 includes a plurality of protrusion portions 24 and a plurality of extension portions 26. Each extension portion 26 is connected to adjacent protrusion portions 24. Within the middle region 20, each metal grid 14 is simultaneously covered by one protrusion portion 24 and one extension portion 26 of the organic layer 16. Specifically, there is a distance "dm" between the center axis 24' of one protrusion portion 24 of the organic layer 16 and the center axis 14' of one metal grid 14 covered by the one protrusion portion 24 of the organic layer 16. The protrusion portions 24 of the organic layer 16 are shifted from the metal grids 14 by the distance "dm". However, the metal grids 14 are still protected by the organic layer 16, not exposed to the outside.

The organic layer 16 within the edge region 22 includes a plurality of protrusion portions 24 and a plurality of extension portions 26. Each extension portion 26 is connected to adjacent protrusion portions 24. Within the edge region 22, each metal grid 14 is simultaneously covered by one protrusion portion 24 and one extension portion 26 of the organic layer 16. Specifically, there is a distance "de" between the center axis 24' of one protrusion portion 24 of the organic layer 16 and the center axis 14' of one metal grid 14 covered by the one protrusion portion 24 of the organic layer 16. The protrusion portions 24 of the organic layer 16 are shifted from the metal grids 14 by the distance "de". However, the metal grids 14 are still protected by the organic layer 16, not exposed to the outside. Furthermore, the distance "de" between the center axis 24' of one protrusion portion 24 of the organic layer 16 and the center axis 14' of one metal grid 14 covered by the one protrusion portion 24 of the organic layer 16 within the edge region 22 is greater than the distance "dm" between the center axis 24' of one protrusion portion 24 of the organic layer 16 and the center axis 14' of one metal grid 14 covered by the one protrusion portion 24 of the organic layer 16 within the middle region 20.

In some embodiments, the organic layer 16 has a refractive index which is in a range from about 1.2 to about 1.45.

In some embodiments, each extension portion 26 of the organic layer 16 has a thickness which is in a range from about 0.05 μm to about 0.2 μm. For example, the thickness "Ta" of the extension portion 26 of the organic layer 16 which is conformally formed on the substrate 12 is in a range from about 0.05 μm to about 0.2 μm. For example, the thickness "Tb" of the extension portion 26 of the organic layer 16 which is conformally formed on the top surface 14" of the metal grid 14 is in a range from about 0.05 μm to about 0.2 μm.

In some embodiments, the distance "de" between the center axis 24' of one protrusion portion 24 of the organic layer 16 and the center axis 14' of one metal grid 14 covered by the one protrusion portion 24 of the organic layer 16 within the edge region 22 is at least half of the width "W" of the one metal grid 14.

In some embodiments, the distance between the center axis 24' of one protrusion portion 24 of the organic layer 16 and the center axis 14' of one metal grid 14 is gradually increased from the center region 18 to the edge region 22. That is, the region size "S" of the extension portion 26 of the organic layer 16 which is conformally formed on the top surface 14" of the metal grid 14 is gradually increased from the center region 18 to the edge region 22.

In some embodiments, the distance between the center axis 24' of one protrusion portion 24 of the organic layer 16 and the center axis 14' of one metal grid 14 is adjusted in accordance with the demands (such as receiving light with a specific incidence angle) of the products.

In some embodiments, color filters, such as red, green or blue color filter (not shown), are further filled into a region which is surrounded by the protrusion portions 24 and the extension portions 26 of the organic layer 16.

Referring to FIGS. 2A-2G, in accordance with one embodiment of the invention, a method for fabricating the optical element 10 is provided. FIGS. 2A-2G show cross-sectional views of the method for fabricating the optical element 10. In FIGS. 2A-2G, the fabrication method of a part of the structure of the optical element 10 within the edge region 22 is used as an example.

Figure 2A:
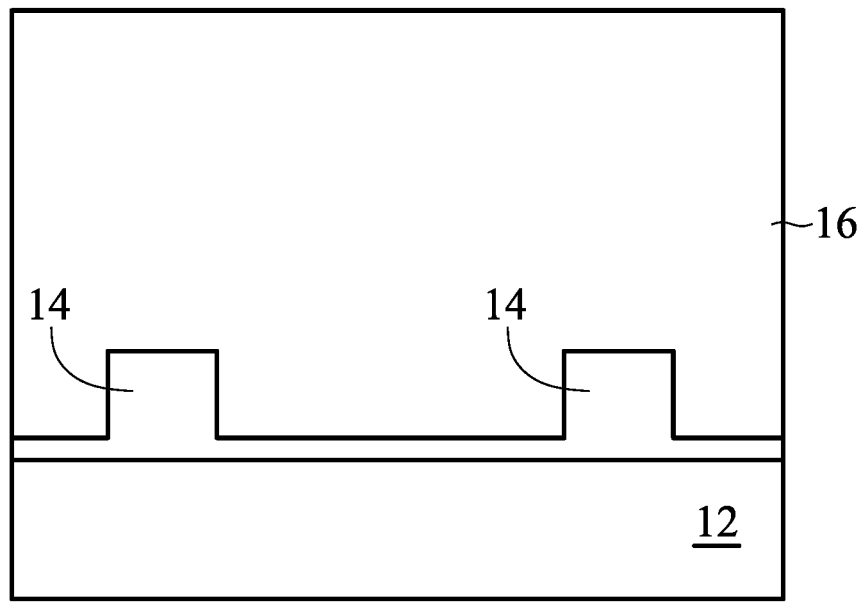
FIGS. 2A-2G are cross-sectional views of a method for fabricating an optical element in accordance with one embodiment of the invention.

Referring to FIG. 2A, a substrate 12 is provided. A plurality of metal grids 14 are formed on the substrate 12. An organic layer 16 is formed on the substrate 12 and the metal grids 14.

In some embodiments, the organic layer 16 has a refractive index which is in a range from about 1.2 to about 1.45.

Figure 2B:
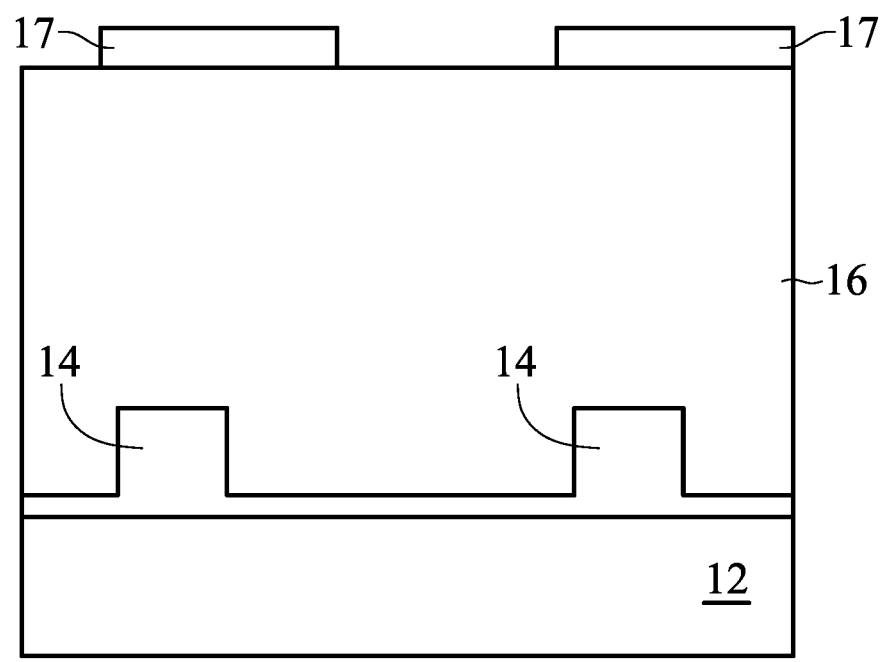

Next, referring to FIG. 2B, a patterned mask layer 17 is formed on the organic layer 16.

Figure 2C:
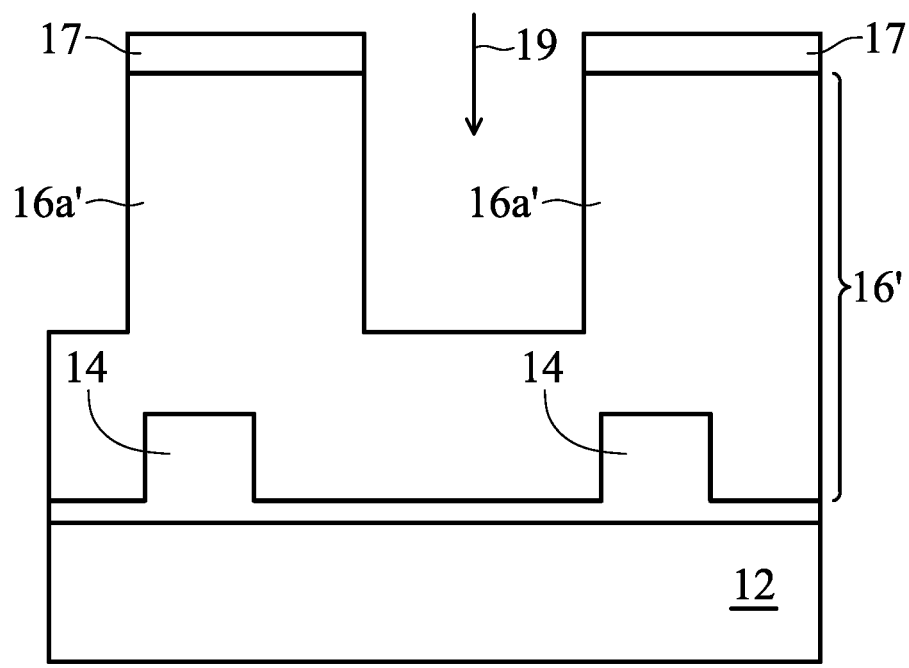

Next, referring to FIG. 2C, the organic layer 16 is etched by a first etching process 19 using the patterned mask layer 17 as a mask to form a first patterned organic layer 16' which covers the metal grids 14. The first patterned organic layer 16' includes a plurality of first protrusion portions 16a'. The first patterned organic layer 16' covering the metal grids 14 is used as a protection layer of the metal grids 14 for a subsequent etching process.

In some embodiments, the first etching process 19 uses haloalkyl gas, such as CF4, CHF3 or CH2F2, as an etching gas.

Figure 2D:
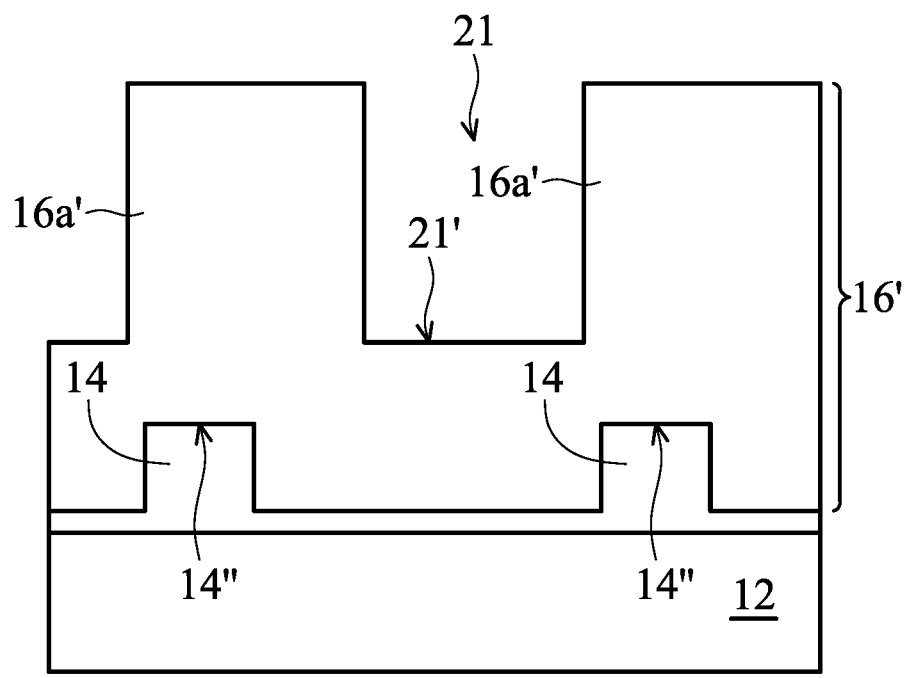

Next, referring to FIG. 2D, the patterned mask layer 17 is removed from the first patterned organic layer 16'.

As shown in FIG. 2D, after the first etching process 19, a plurality of first trenches 21 are formed and surrounded by the first protrusion portions 16a' of the first patterned organic layer 16'.

As shown in FIG. 2D, the bottom 21' of the first trench 21 is over the top surface 14" of the metal grid 14.

Figure 2E:
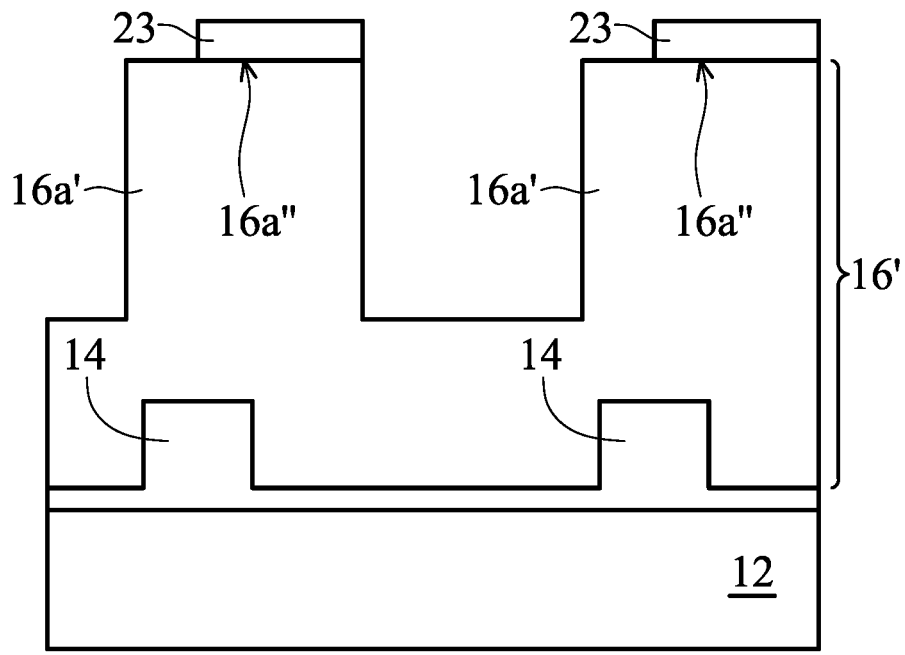

Next, referring to FIG. 2E, a patterned mask layer 23 is formed on a part of the top surface 16a" of the first protrusion portion 16a' of the first patterned organic layer 16' as a mask.

Figure 2F:
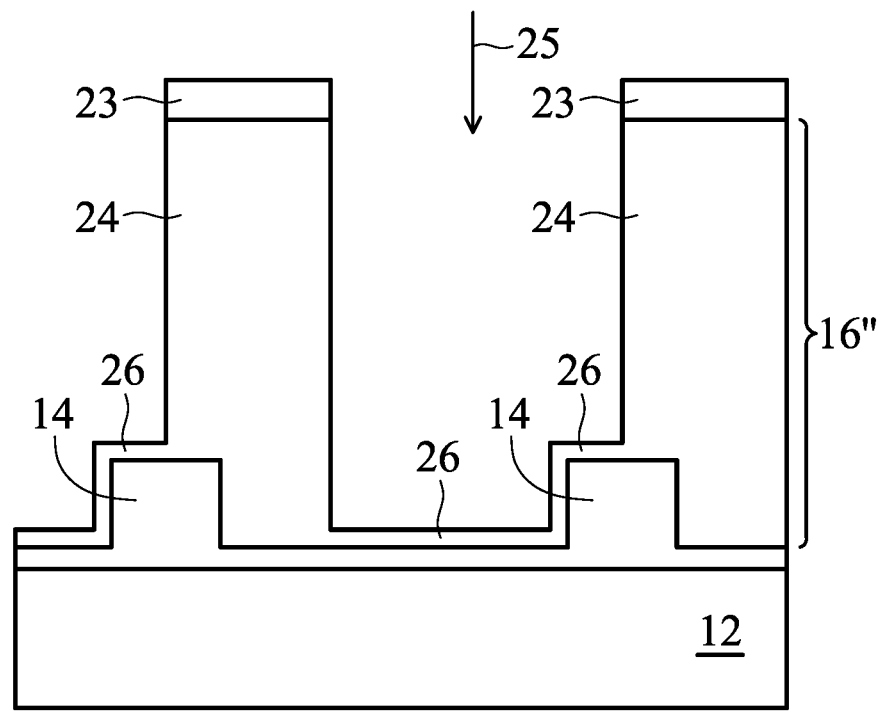

Next, referring to FIG. 2F, the first patterned organic layer 16' is etched by a second etching process 25 using the patterned mask layer 23 as a mask to form a second patterned organic layer 16" which includes a plurality of second protrusion portions 24 and a plurality of extension portions 26. Each second protrusion portion 24 covers one metal grid 14. The extension portions 26 cover the metal grids 14 and connect to adjacent second protrusion portions 24.

In some embodiments, the second etching process 25 uses haloalkyl gas, such as CF4, CHF3 or CH2F2, as an etching gas.

Figure 2G:
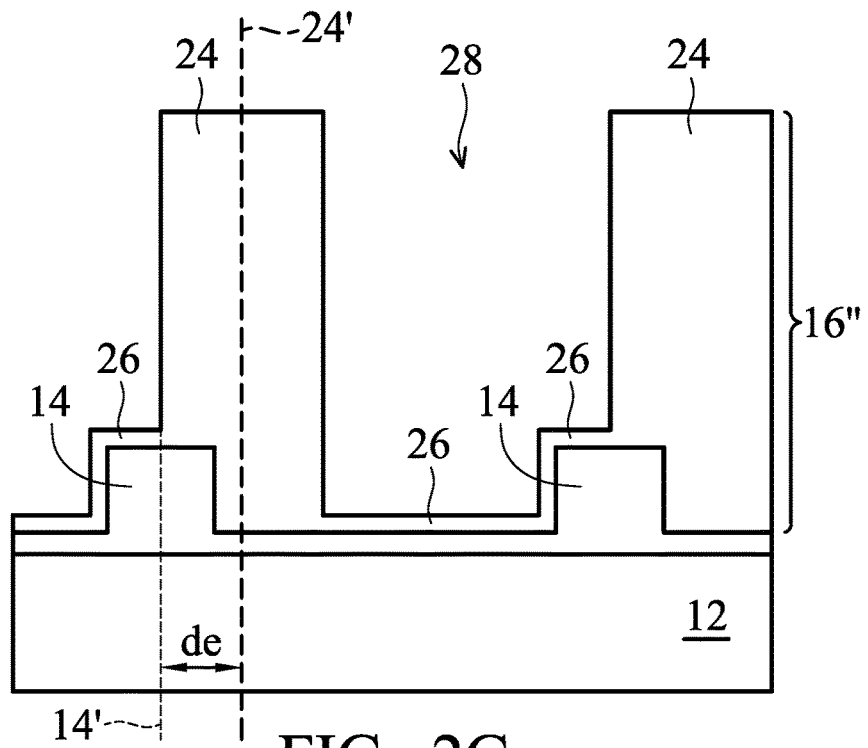

Next, referring to FIG. 2G, the patterned mask layer 23 is removed from the second patterned organic layer 16".

As shown in FIG. 2G, after the second etching process 25, a plurality of second trenches 28 are formed and surrounded by the second protrusion portions 24 of the second patterned organic layer 16".

As shown in FIG. 2G, the second protrusion portion 24 of the second patterned organic layer 16" covers a part of the metal grid 14. The extension portion 26 conformally covers the substrate 12 and a part of the metal grid 14. Specifically, there is a distance "de" between the center axis 24' of one second protrusion portion 24 of the second patterned organic layer 16" and the center axis 14' of one metal grid 14 covered by the one second protrusion portion 24 of the second patterned organic layer 16".

Next, color filters, such as red, green or blue color filter (not shown), are filled into the second trenches 28 which are surrounded by the second protrusion portions 24 and the extension portions 26 of the second patterned organic layer 16".

Therefore, a part of the structure of the optical element 10 within the edge region 22 of FIG. 1 is fabricated.

The fabrication method of the other parts of the structure of the optical element 10 within the center region 18 and the middle region 20 of FIG. 1 is similar to FIGS. 2A-2G. The distinction therebetween is that various sizes and locations of the patterned mask layer are adjusted for the etching processes.

Referring to FIGS. 3A-3G, in accordance with one embodiment of the invention, a method for fabricating the optical element 10 is provided. FIGS. 3A-3G show cross-sectional views of the method for fabricating the optical element 10. In FIGS. 3A-3G, the fabrication method of a part of the structure of the optical element 10 within the edge region 22 is used as an example.

Figure 3A:
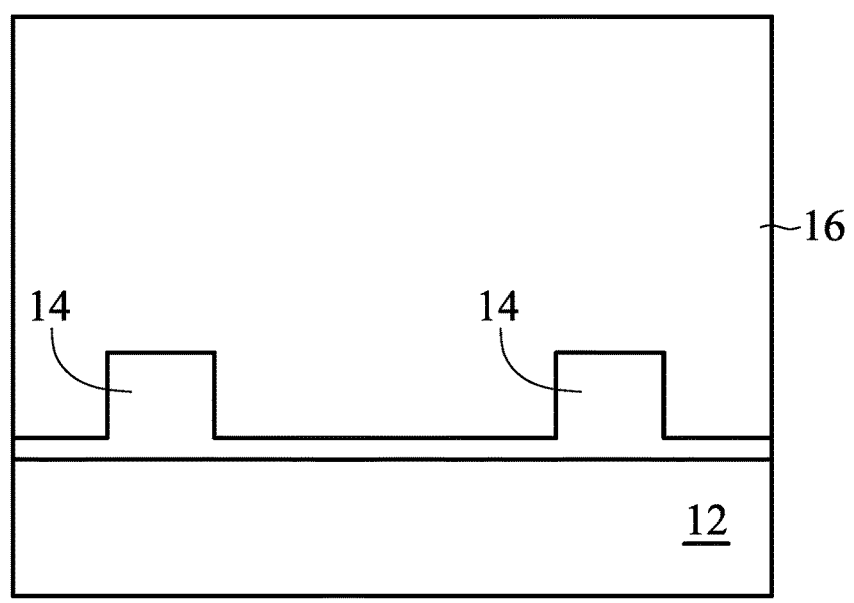
FIGS. 3A-3G are cross-sectional views of a method for fabricating an optical element in accordance with one embodiment of the invention.

Referring to FIG. 3A, a substrate 12 is provided. A plurality of metal grids 14 are formed on the substrate 12. An organic layer 16 is formed on the substrate 12 and the metal grids 14.

In some embodiments, the organic layer 16 has a refractive index which is in a range from about 1.2 to about 1.45.

Figure 3B:
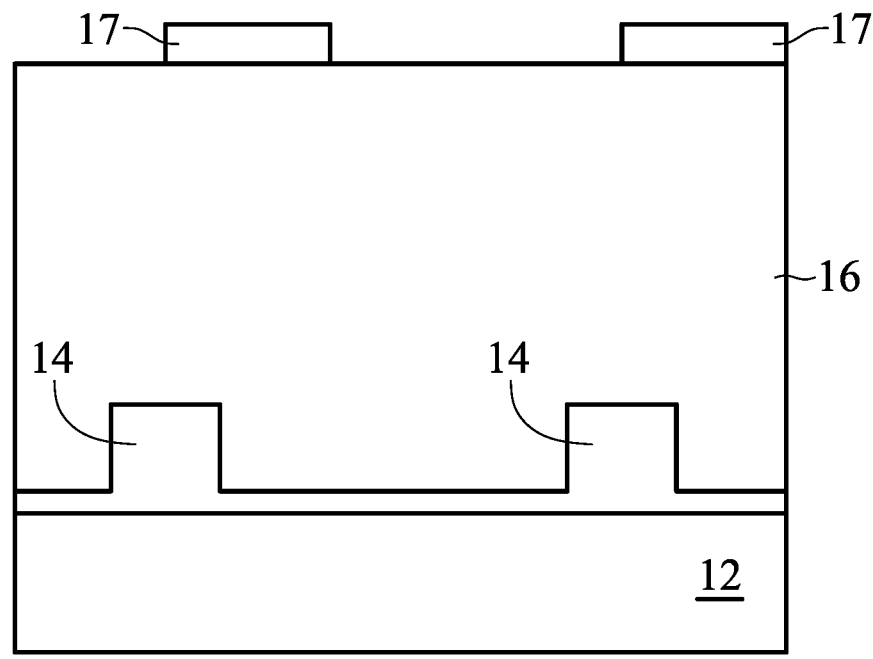

Next, referring to FIG. 3B, a patterned mask layer 17 is formed on the organic layer 16.

Figure 3C:
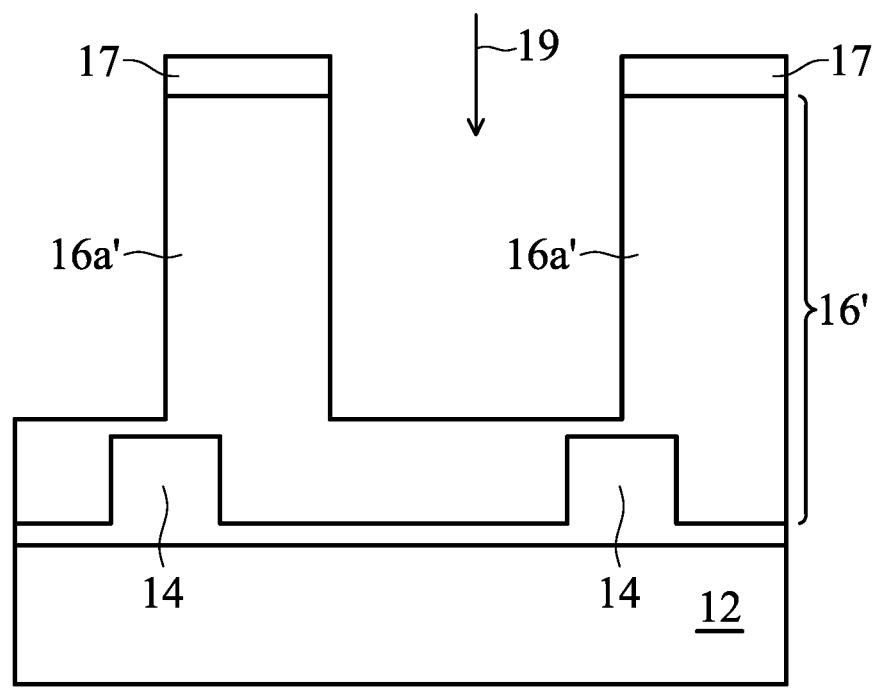

Next, referring to FIG. 3C, the organic layer 16 is etched by a first etching process 19 using the patterned mask layer 17 as a mask to form a first patterned organic layer 16' which covers the metal grids 14. The first patterned organic layer 16' includes a plurality of first protrusion portions 16a'. The first patterned organic layer 16' covering the metal grids 14 is used as a protection layer of the metal grids 14 for a subsequent etching process.

In some embodiments, the first etching process 19 uses haloalkyl gas, such as CF4, CHF3 or CH2F2, as an etching gas.

Figure 3D:
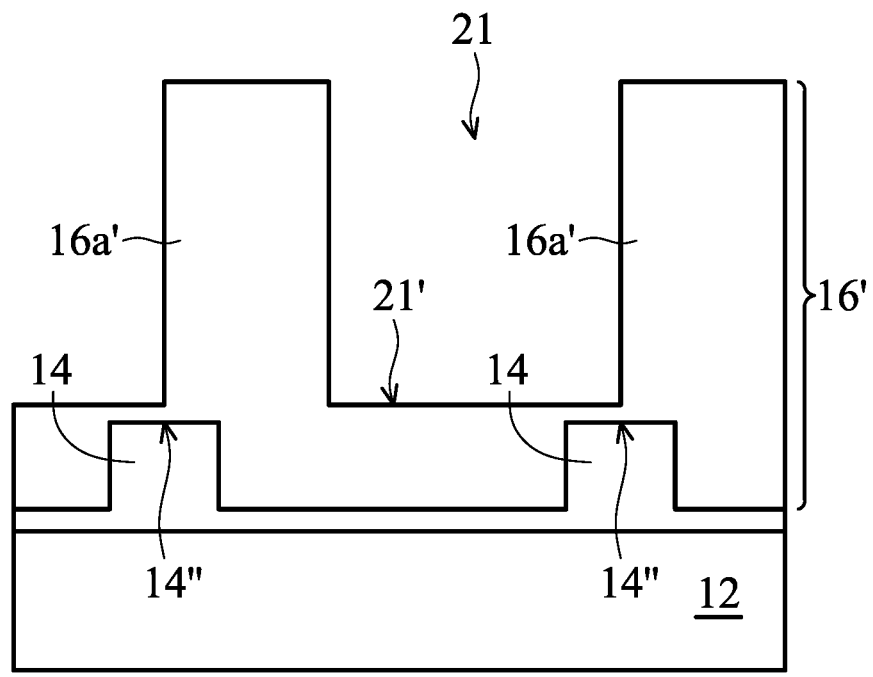

Next, referring to FIG. 3D, the patterned mask layer 17 is removed from the first patterned organic layer 16'.

As shown in FIG. 3D, after the first etching process 19, a plurality of first trenches 21 are formed and surrounded by the first protrusion portions 16a' of the first patterned organic layer 16'.

As shown in FIG. 3D, the bottom 21' of the first trench 21 is over the top surface 14" of the metal grid 14.

Figure 3E:
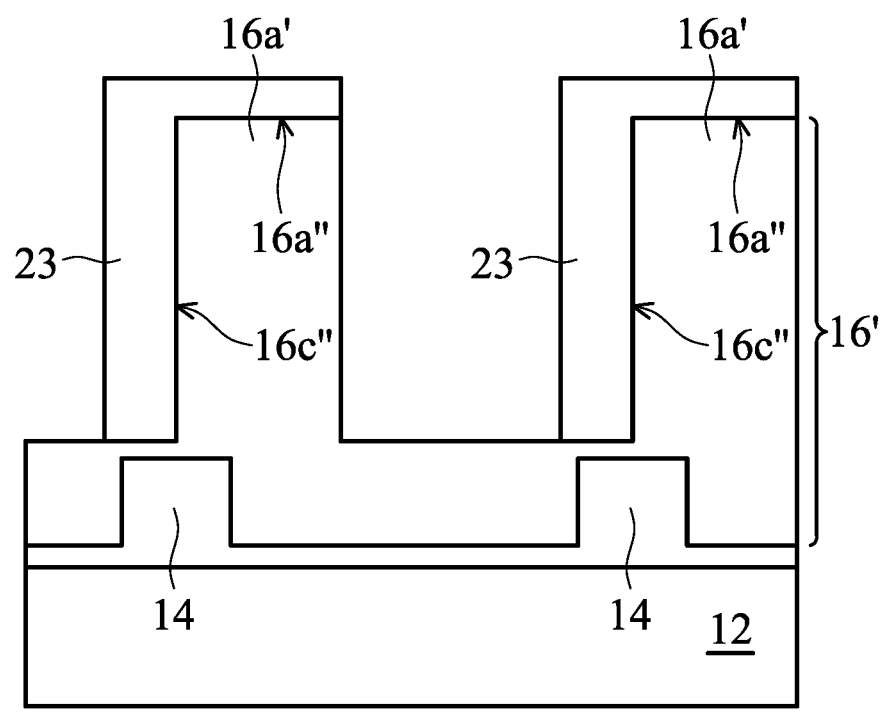

Next, referring to FIG. 3E, a patterned mask layer 23 is formed on the top surface 16a" and a part of the sidewalls 16c" of the first protrusion portion 16a' of the first patterned organic layer 16' as a mask.

Figure 3F:
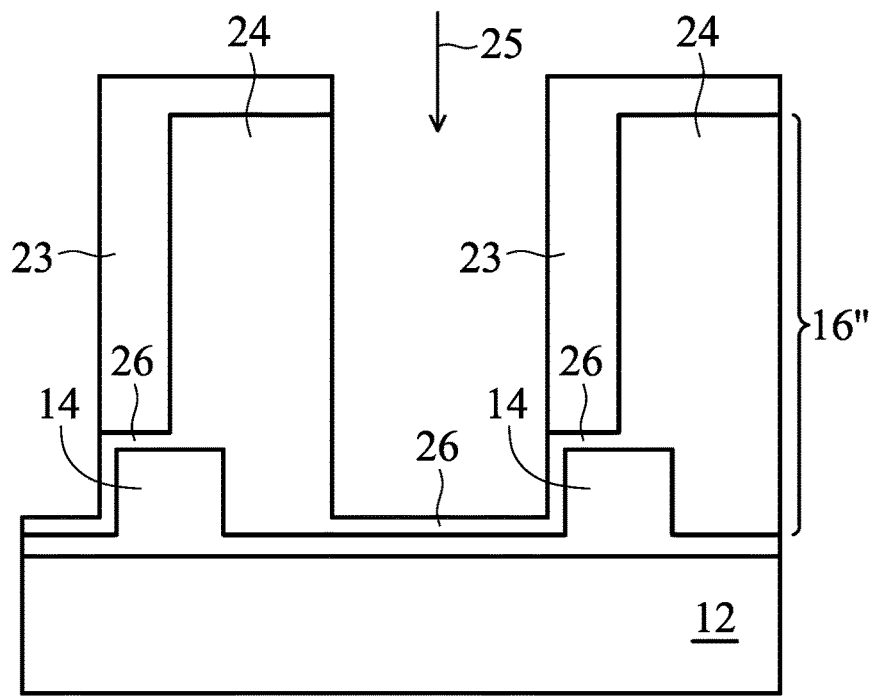

Next, referring to FIG. 3F, the first patterned organic layer 16' is etched by a second etching process 25 using the patterned mask layer 23 as a mask to form a second patterned organic layer 16" which includes a plurality of second protrusion portions 24 and a plurality of extension portions 26. Each second protrusion portion 24 covers one metal grid 14. The extension portions 26 cover the metal grids 14 and connect to adjacent second protrusion portions 24.

In some embodiments, the second etching process 25 uses haloalkyl gas, such as CF4, CHF3 or CH2F2, as an etching gas.

Figure 3G:
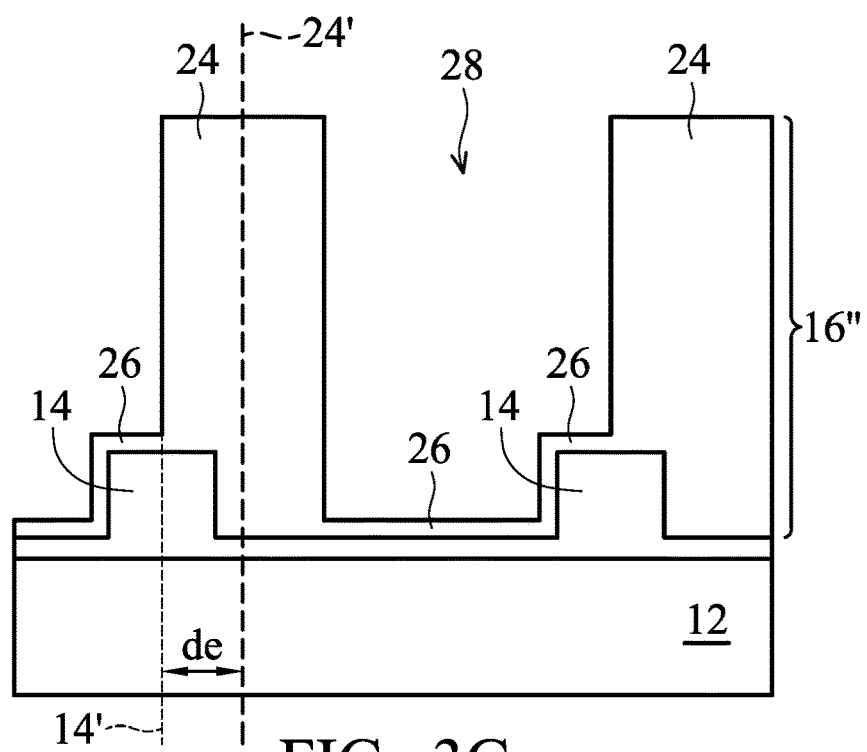

Next, referring to FIG. 3G, the patterned mask layer 23 is removed from the second patterned organic layer 16".

As shown in FIG. 3G, after the second etching process 25, a plurality of second trenches 28 are formed and surrounded by the second protrusion portions 24 of the second patterned organic layer 16".

As shown in FIG. 3G, the second protrusion portion 24 of the second patterned organic layer 16" covers a part of the metal grid 14. The extension portion 26 conformally covers the substrate 12 and a part of the metal grid 14. Specifically, there is a distance "de" between the center axis 24' of one second protrusion portion 24 of the second patterned organic layer 16" and the center axis 14' of one metal grid 14 covered by the one second protrusion portion 24 of the second patterned organic layer 16".

Next, color filters, such as red, green or blue color filter (not shown), are filled into the second trenches 28 which are surrounded by the second protrusion portions 24 and the extension portions 26 of the second patterned organic layer 16".

Therefore, a part of the structure of the optical element 10 within the edge region 22 of FIG. 1 is fabricated.

The fabrication method of the other parts of the structure of the optical element 10 within the center region 18 and the middle region 20 of FIG. 1 is similar to FIGS. 3A-3G. The distinction therebetween is that various sizes and locations of the patterned mask layer are adjusted for the etching processes.

Referring to FIGS. 4A-4G, in accordance with one embodiment of the invention, a method for fabricating the optical element 10 is provided. FIGS. 4A-4G show cross-sectional views of the method for fabricating the optical element 10. In FIGS. 4A-4G, the fabrication method of a part of the structure of the optical element 10 within the edge region 22 is used as an example.

Figure 4A:
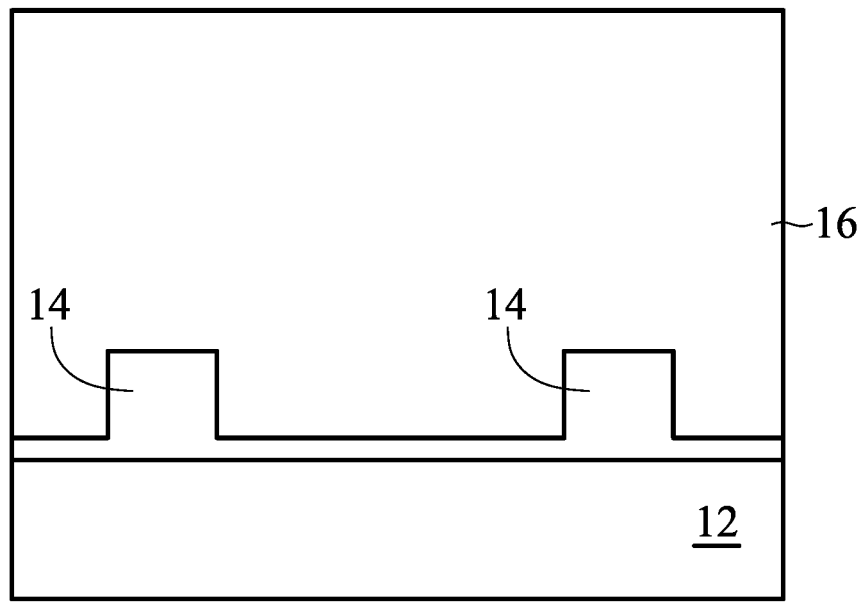
FIGS. 4A-4G are cross-sectional views of a method for fabricating an optical element in accordance with one embodiment of the invention.

Referring to FIG. 4A, a substrate 12 is provided. A plurality of metal grids 14 are formed on the substrate 12. An organic layer 16 is formed on the substrate 12 and the metal grids 14.

In some embodiments, the organic layer 16 has a refractive index which is in a range from about 1.2 to about 1.45.

Figure 4B:
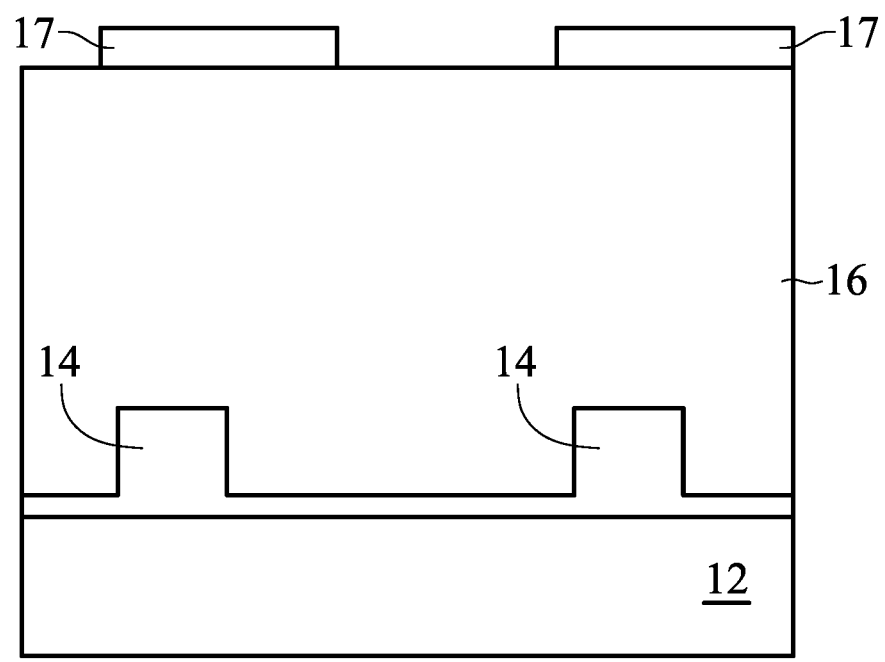

Next, referring to FIG. 4B, a patterned mask layer 17 is formed on the organic layer 16.

Figure 4C:
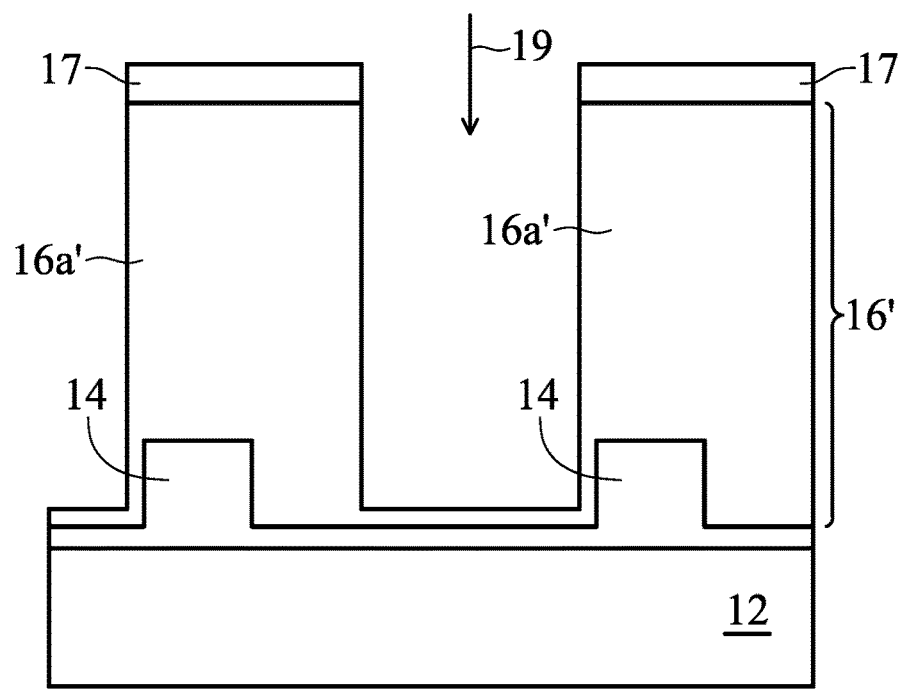

Next, referring to FIG. 4C, the organic layer 16 is etched by a first etching process 19 using the patterned mask layer 17 as a mask to form a first patterned organic layer 16' which covers the metal grids 14. The first patterned organic layer 16' includes a plurality of first protrusion portions 16a'. The first patterned organic layer 16' covering the metal grids 14 is used as a protection layer of the metal grids 14 for a subsequent etching process.

In some embodiments, the first etching process 19 uses haloalkyl gas, such as CF4, CHF3 or CH2F2, as an etching gas.

Figure 4D:
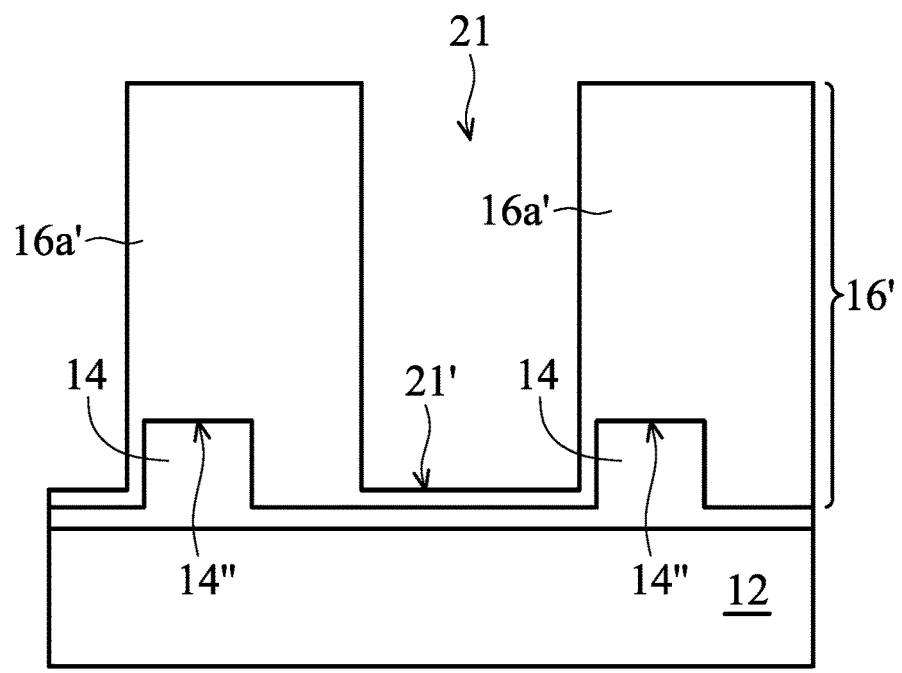

Next, referring to FIG. 4D, the patterned mask layer 17 is removed from the first patterned organic layer 16'.

As shown in FIG. 4D, after the first etching process 19, a plurality of first trenches 21 are formed and surrounded by the first protrusion portions 16a' of the first patterned organic layer 16'.

As shown in FIG. 4D, the bottom 21' of the first trench 21 is under the top surface 14" of the metal grid 14.

Figure 4E:
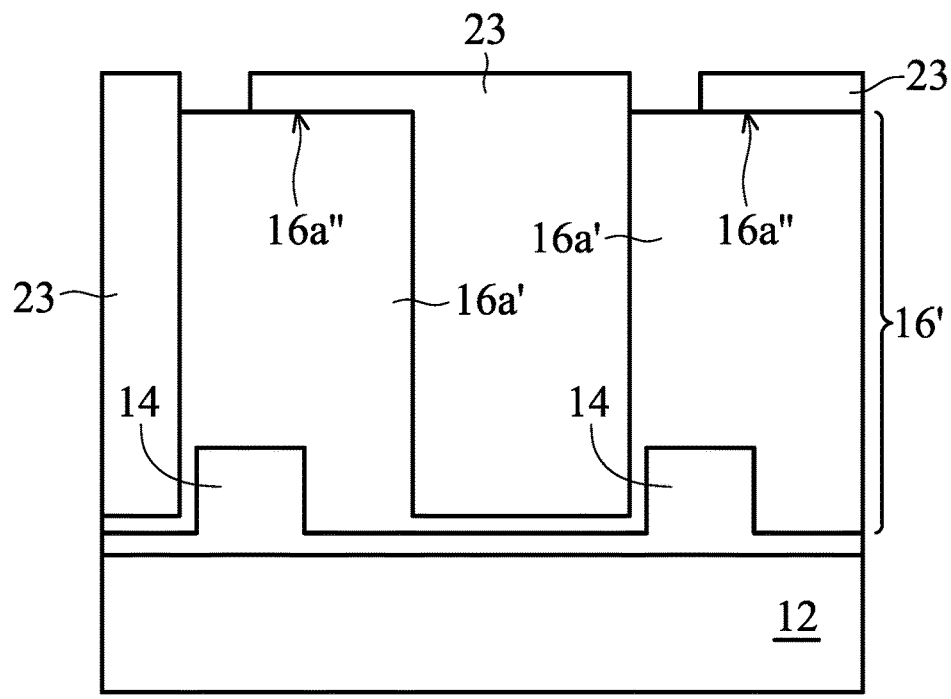

Next, referring to FIG. 4E, a patterned mask layer 23 is formed on a part of the top surface 16a" of the first protrusion portion 16a' of the first patterned organic layer 16' and filled into the first trenches 21 as a mask.

Figure 4F:
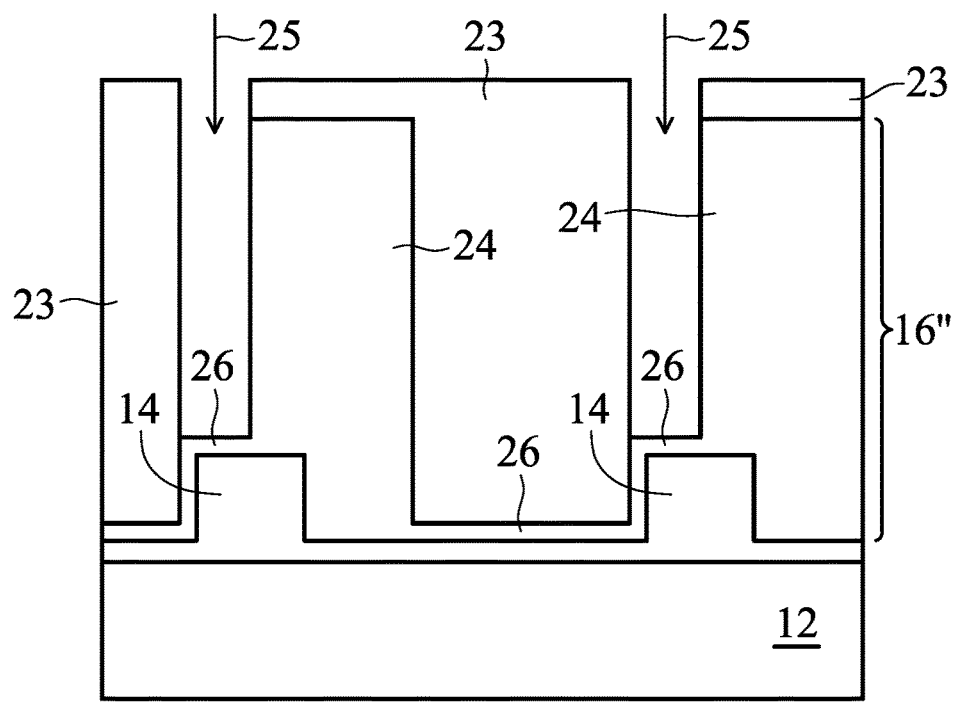

Next, referring to FIG. 4F, the first patterned organic layer 16' is etched by a second etching process 25 using the patterned mask layer 23 as a mask to form a second patterned organic layer 16" which includes a plurality of second protrusion portions 24 and a plurality of extension portions 26. Each second protrusion portion 24 covers one metal grid 14. The extension portions 26 cover the metal grids 14 and connect to adjacent second protrusion portions 24.

In some embodiments, the second etching process 25 uses haloalkyl gas, such as CF4, CHF3 or CH2F2, as an etching gas.

Figure 4G:
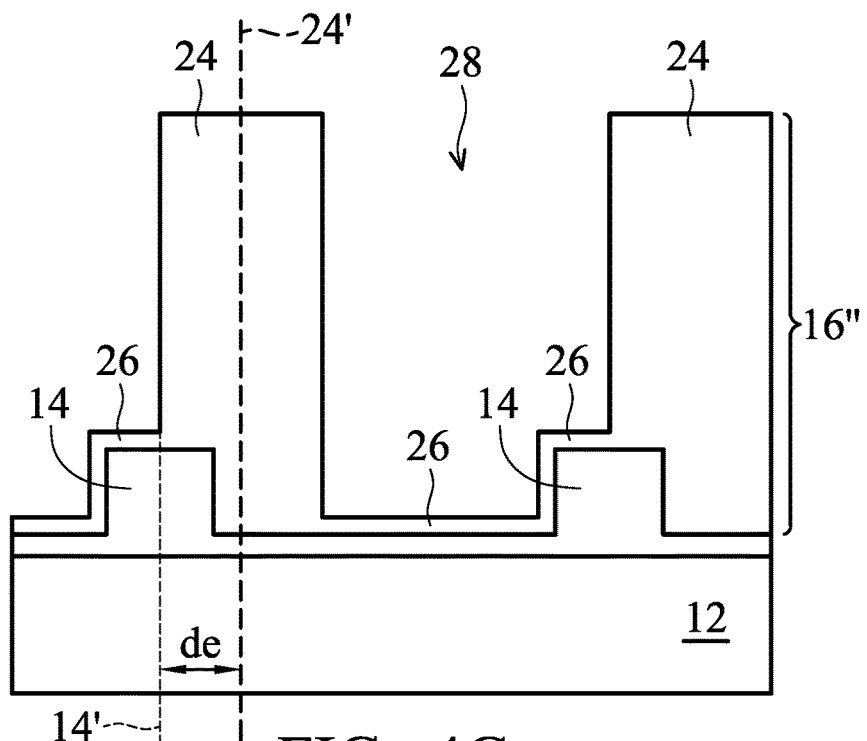

Next, referring to FIG. 4G, the patterned mask layer 23 is removed from the second patterned organic layer 16".

As shown in FIG. 4G, after the second etching process 25, a plurality of second trenches 28 are formed and surrounded by the second protrusion portions 24 of the second patterned organic layer 16".

As shown in FIG. 4G, the second protrusion portion 24 of the second patterned organic layer 16" covers a part of the metal grid 14. The extension portion 26 conformally covers the substrate 12 and a part of the metal grid 14. Specifically, there is a distance "de" between the center axis 24' of one second protrusion portion 24 of the second patterned organic layer 16" and the center axis 14' of one metal grid 14 covered by the one second protrusion portion 24 of the second patterned organic layer 16".

Next, color filters, such as red, green or blue color filter (not shown), are filled into the second trenches 28 which are surrounded by the second protrusion portions 24 and the extension portions 26 of the second patterned organic layer 16".

Therefore, a part of the structure of the optical element 10 within the edge region 22 of FIG. 1 is fabricated.

The fabrication method of the other parts of the structure of the optical element 10 within the center region 18 and the middle region 20 of FIG. 1 is similar to FIGS. 4A-4G. The distinction therebetween is that various sizes and locations of the patterned mask layer are adjusted for the etching processes.

Referring to FIGS. 5A-5F, in accordance with one embodiment of the invention, a method for fabricating an optical element is provided. FIGS. 5A-5F show cross-sectional views of the method for fabricating the optical element. In FIGS. 5A-5F, the fabrication method of a part of the structure of the optical element within an edge region of a substrate is used as an example.

Figure 5A:
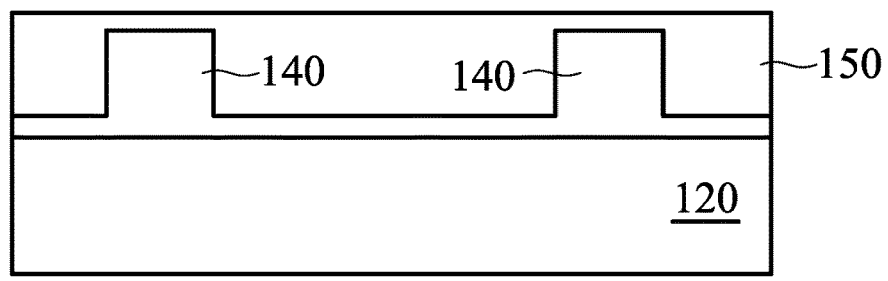
FIGS. 5A-5F are cross-sectional views of a method for fabricating an optical element in accordance with one embodiment of the invention.

Referring to FIG. 5A, a substrate 120 is provided. A plurality of metal grids 140 are formed on the substrate 120. A first organic layer 150 is formed on the substrate 120 and the metal grids 140. The first organic layer 150 covers the top surface of each metal grid 140.

In some embodiments, the first organic layer 150 has a refractive index which is in a range from about 1.4 to about 1.55.

Figure 5B:
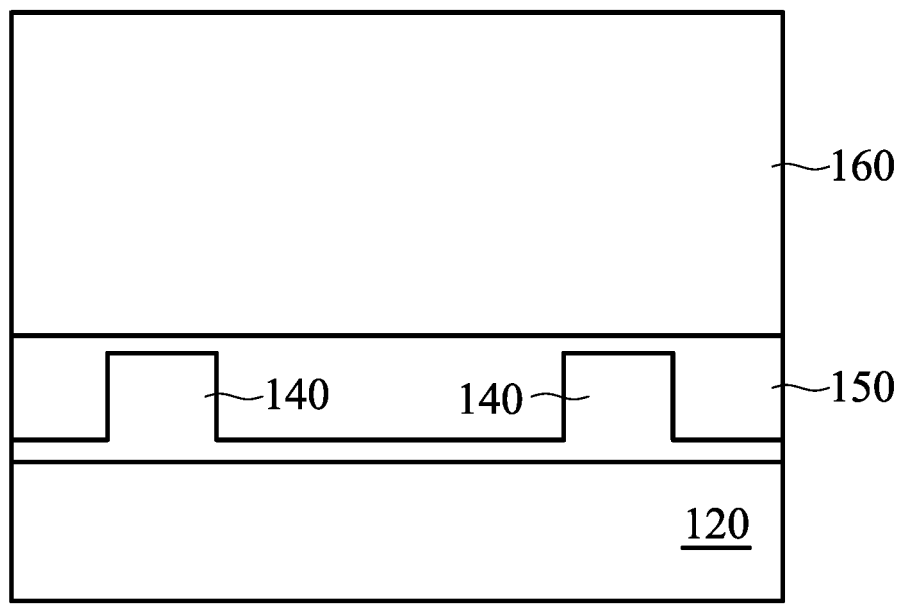

Referring to FIG. 5B, a second organic layer 160 is formed on the first organic layer 150.

In some embodiments, the second organic layer 160 has a refractive index which is in a range from about 1.2 to about 1.45.

Figure 5C:
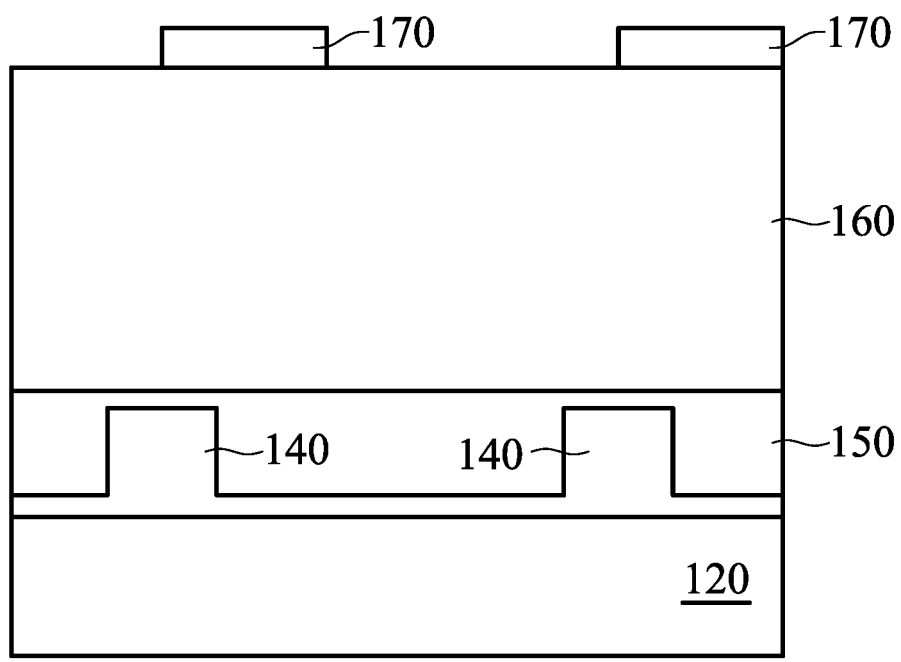

Next, referring to FIG. 5C, a patterned mask layer 170 is formed on the second organic layer 160.

Figure 5D:
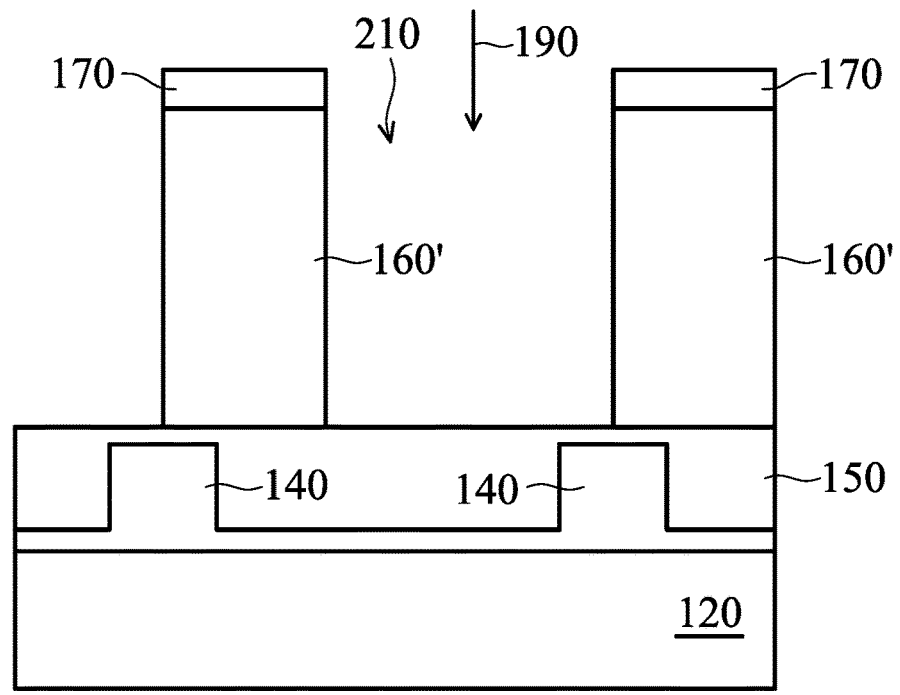

Next, referring to FIG. 5D, the second organic layer 160 is etched by a first etching process 190 using the patterned mask layer 170 as a mask to form a plurality of first protrusion portions 160' and a plurality of first trenches 210 surrounded by the first protrusion portions 160', exposing the first organic layer 150. The bottom of each first trench 210 is over the top surface of each metal grid 140. Therefore, the first organic layer 150 covering the metal grids 140 is used as a protection layer of the metal grids 140 for a subsequent etching process.

In some embodiments, the first etching process 190 uses haloalkyl gas, such as CF4, CHF3 or CH2F2, as an etching gas.

Figure 5E:
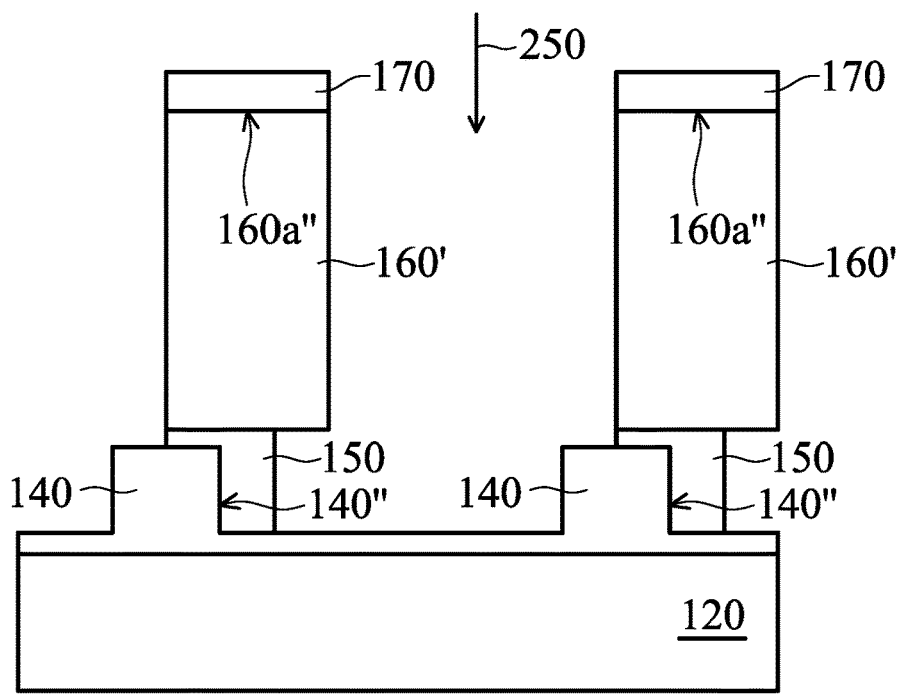

Next, referring to FIG. 5E, the first organic layer 150 is etched by a second etching process 250 using the patterned mask layer 170 which is formed on the top surface 160a" of the first protrusion portions 160' as a mask to form a plurality of second protrusion portions 160' on the metal grids 140. After the second etching process 250, a part of the first organic layer 150 is left between the second protrusion portions 160' and the metal grids 140. A part of the first organic layer 150 is left on a part of the sidewalls 140" of the metal grids 140. Each second protrusion portion 160' covers a part of one metal grid 140.

In some embodiments, the second etching process 250 uses, for example, oxygen, carbon dioxide or nitrogen as an etching gas. The etching gas used in the second etching process 250 does not cause damage to the metal grids 140.

Figure 5F:
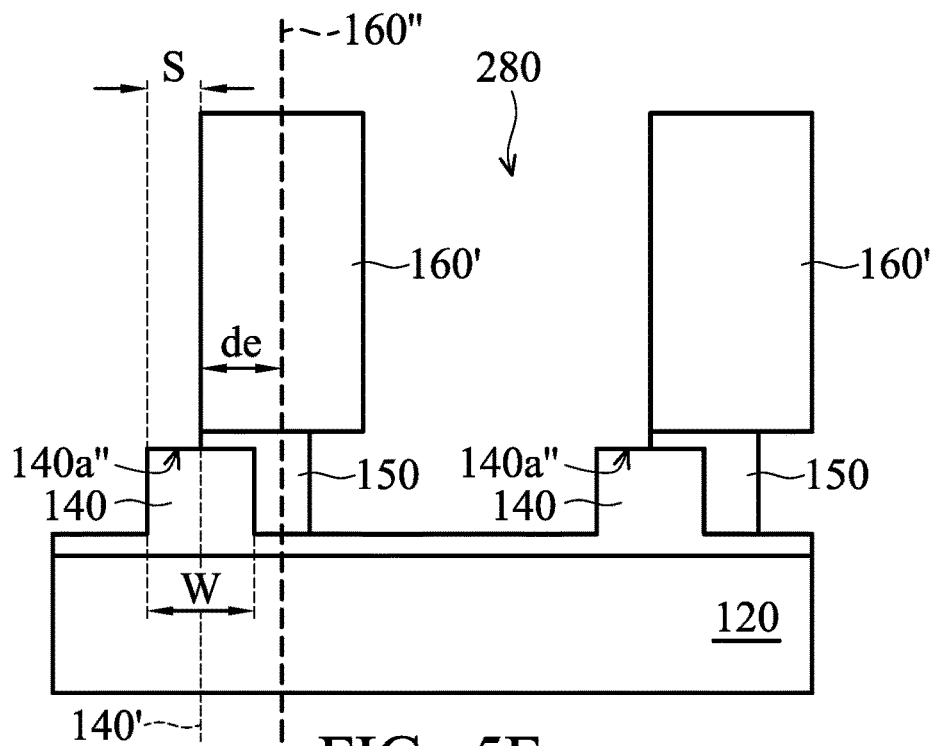

Next, referring to FIG. 5F, the patterned mask layer 170 is removed from the second protrusion portions 160'.

As shown in FIG. 5F, after the second etching process 250, a plurality of second trenches 280 are formed and surrounded by the second protrusion portions 160'.

As shown in FIG. 5F, there is a distance "de" between the center axis 160" of one second protrusion portion 160' and the center axis 140' of one metal grid 140 covered by the one second protrusion portion 160'. That is, the second protrusion portions 160' are shifted from the metal grids 140 by the distance "de".

In addition, the distance "de" between the center axis 160" of one second protrusion portion 160' and the center axis 140' of one metal grid 140 covered by the one second protrusion portion 160' within the edge region is greater than the distance between the center axis 160" of one second protrusion portion 160' and the center axis 140' of one metal grid 140 covered by the one second protrusion portion 160' within the middle region of the substrate 120.

In some embodiments, the distance "de" between the center axis 160" of one second protrusion portion 160' and the center axis 140' of one metal grid 140 covered by the one second protrusion portion 160' within the edge region is at least half of the width "W" of the one metal grid 140.

In some embodiments, the distance between the center axis 160" of one second protrusion portion 160' and the center axis 140' of one metal grid 140 is gradually increased from the center region to the edge region. That is, the exposed region size "S" of the top surface 140*a*" of the metal grid 140 is gradually increased from the center region to the edge region.

In some embodiments, the distance between the center axis 160" of one second protrusion portion 160' and the center axis 140' of one metal grid 140 is adjusted in accordance with the demands (such as receiving light with a specific incidence angle) of the products.

Next, color filters, such as red, green or blue color filter (not shown), are filled into the second trenches 280 which are surrounded by the second protrusion portions 160'. Therefore, the optical element is fabricated.

Referring to FIGS. 6A-6H, in accordance with one embodiment of the invention, a method for fabricating an optical element is provided. FIGS. 6A-6H show cross-sectional views of the method for fabricating the optical element. In FIGS. 6A-6H, the fabrication method of a part of the structure of the optical element within an edge region of a substrate is used as an example.

Figure 6A:
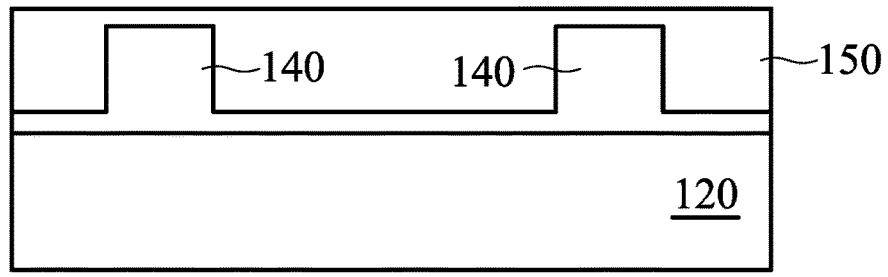
FIGS. 6A-6H are cross-sectional views of a method for fabricating an optical element in accordance with one embodiment of the invention.

Referring to FIG. 6A, a substrate 120 is provided. A plurality of metal grids 140 are formed on the substrate 120. A first organic layer 150 is formed on the substrate 120 and the metal grids 140. The first organic layer 150 covers the top surface of each metal grid 140.

In some embodiments, the first organic layer 150 has a refractive index which is in a range from about 1.4 to about 1.55.

Figure 6B:
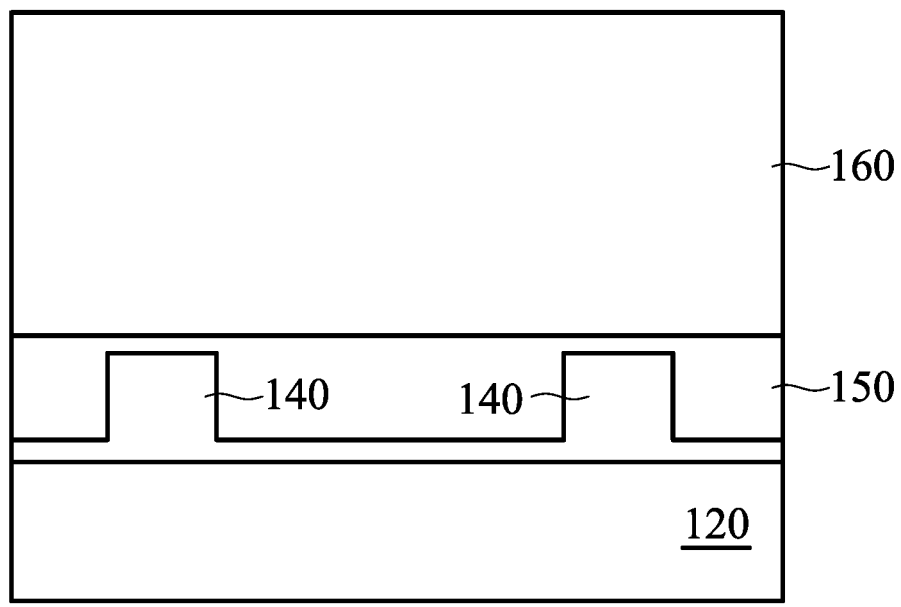

Referring to FIG. 6B, a second organic layer 160 is formed on the first organic layer 150.

In some embodiments, the second organic layer 160 has a refractive index which is in a range from about 1.2 to about 1.45.

Figure 6C:
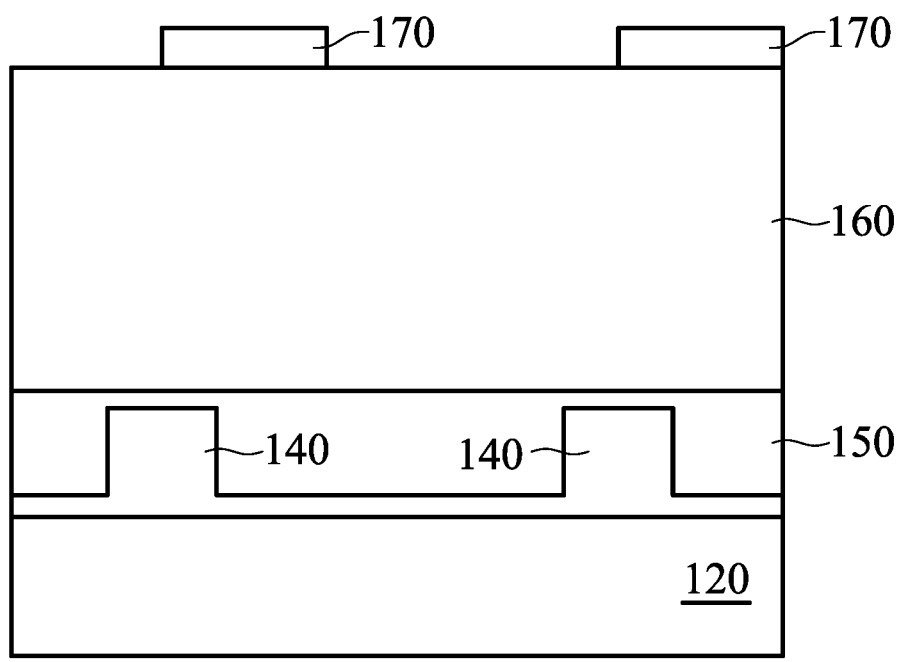

Next, referring to FIG. 6C, a patterned mask layer 170 is formed on the second organic layer 160.

Figure 6D:
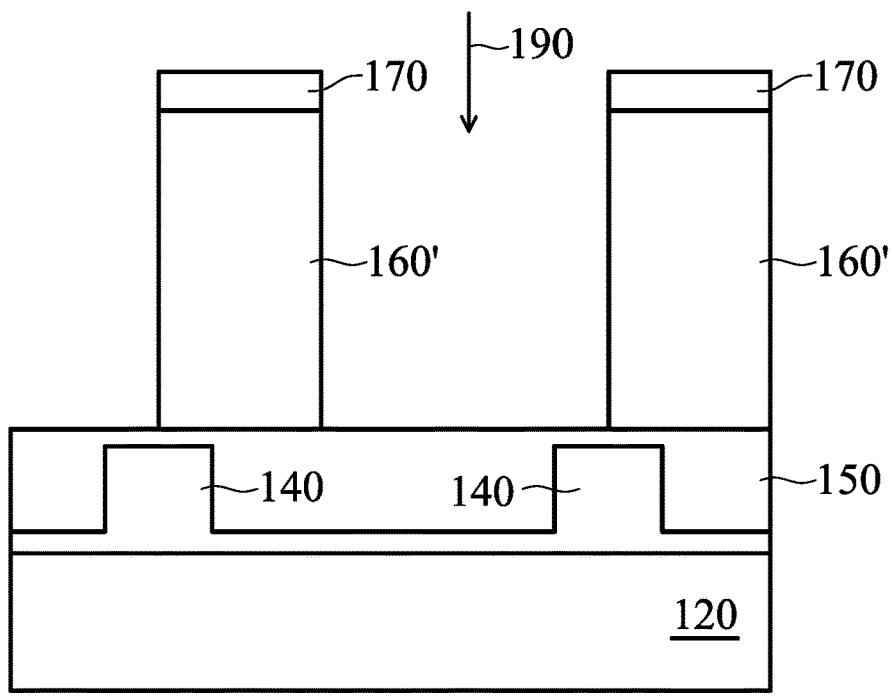

Next, referring to FIG. 6D, the second organic layer 160 is etched by a first etching process 190 using the patterned mask layer 170 as a mask to form a plurality of first protrusion portions 160', exposing the first organic layer 150. The first organic layer 150 covering the metal grids 140 is used as a protection layer of the metal grids 140 for a subsequent etching process.

In some embodiments, the first etching process 190 uses haloalkyl gas, such as CF4, CHF3 or CH2F2, as an etching gas.

Figure 6E:
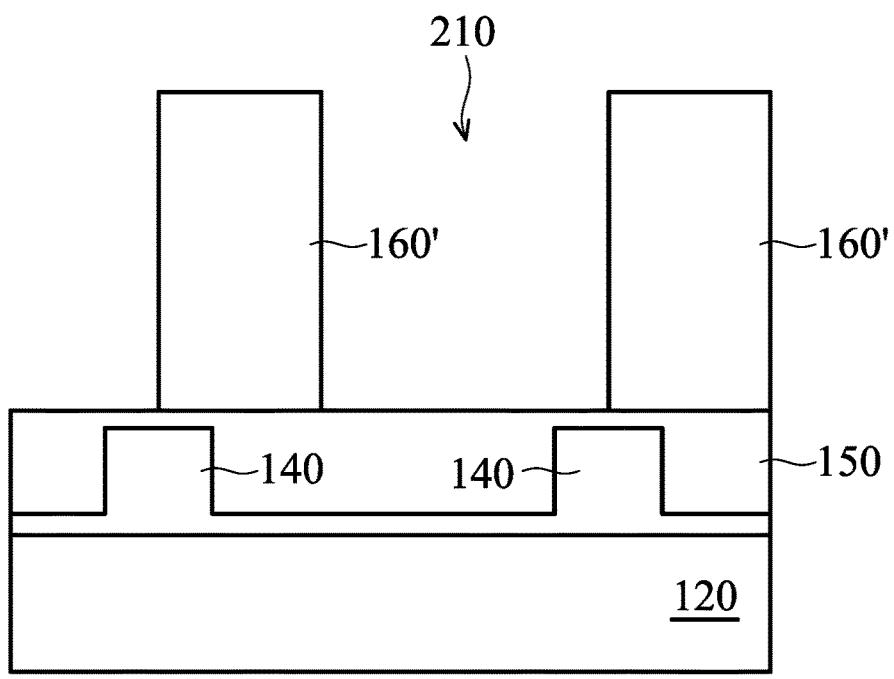

Next, referring to FIG. 6E, the patterned mask layer 170 is removed from the first protrusion portions 160'.

As shown in FIG. 6E, after the first etching process 190, a plurality of first trenches 210 are formed and surrounded by the first protrusion portions 160'. The bottom of each first trench 210 is over the top surface of each metal grid 140.

Figure 6F:
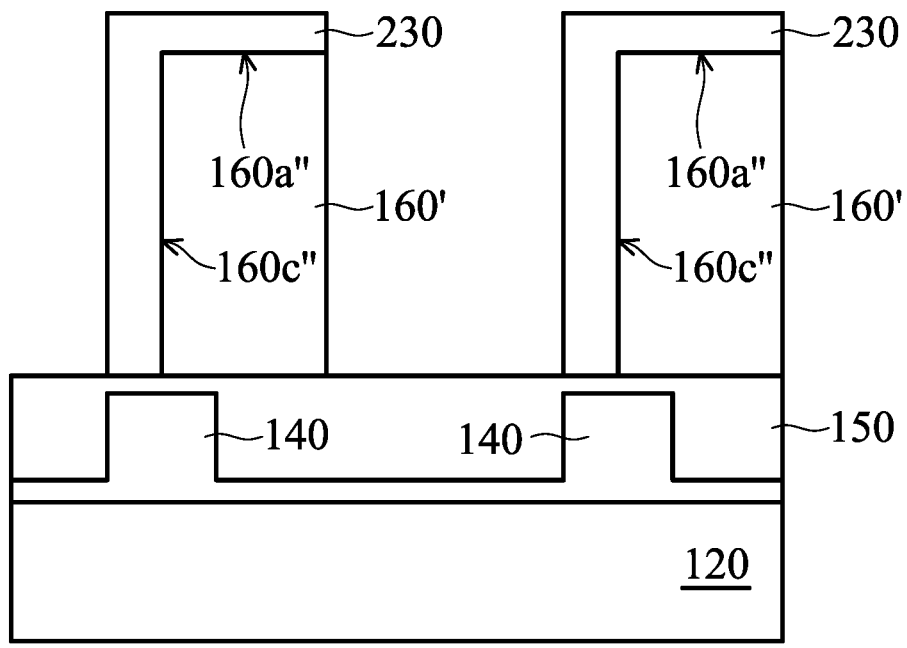

Next, referring to FIG. 6F, a patterned mask layer 230 is formed on the top surface 160*a*" and a part of the sidewalls 160*c*" of the first protrusion portions 160' as a mask.

Figure 6G:
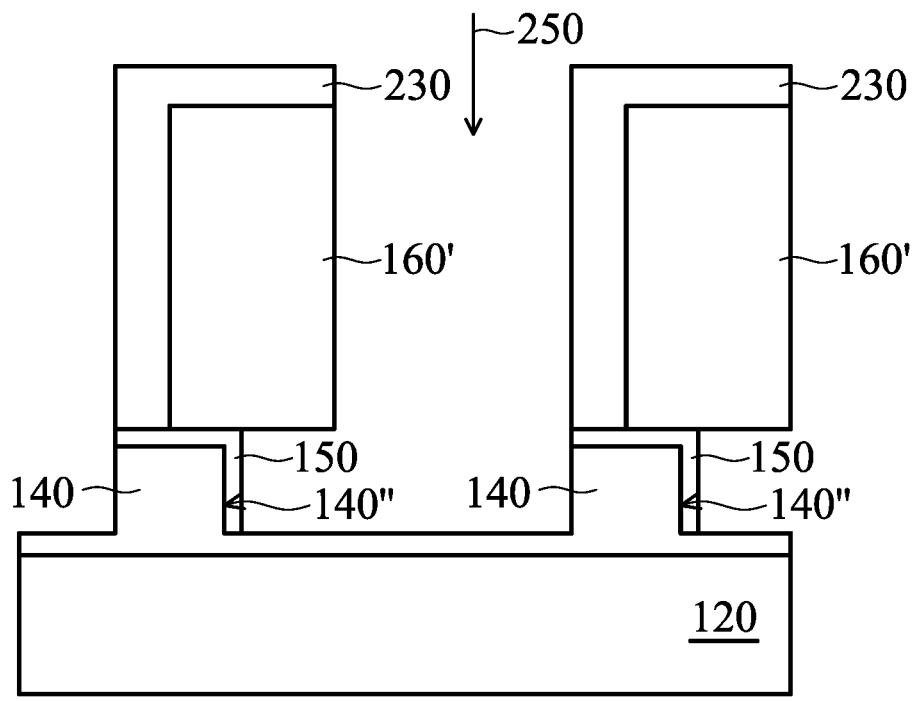

Next, referring to FIG. 6G, the first organic layer 150 is etched by a second etching process 250 using the patterned mask layer 230 as a mask to form a plurality of second protrusion portions 160' on the metal grids 140. After the second etching process 250, a part of the first organic layer 150 is left between the second protrusion portions 160' and the metal grids 140. A part of the first organic layer 150 is left on a part of the sidewalls 140" of the metal grids 140. Each second protrusion portion 160' covers a part of one metal grid 140.

In some embodiments, the second etching process 250 uses, for example, oxygen, carbon dioxide or nitrogen as an etching gas. The etching gas used in the second etching process 250 does not cause damage to the metal grids 140.

Figure 6H:
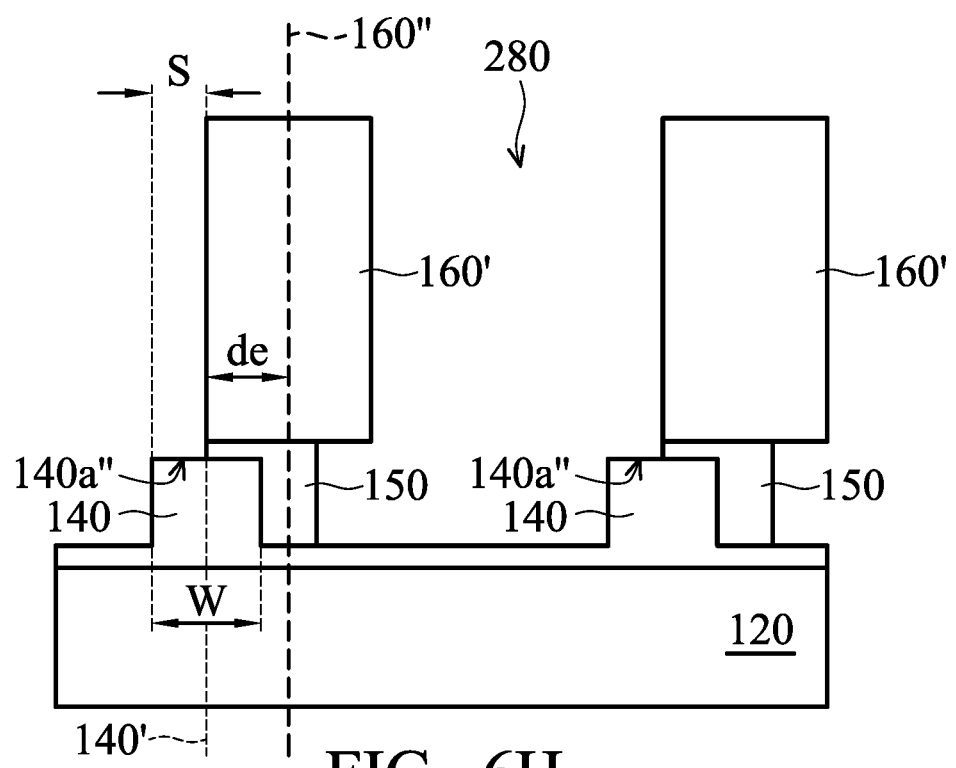

Next, referring to FIG. 6H, the patterned mask layer 230 is removed from the second protrusion portions 160'.

As shown in FIG. 6H, after the second etching process 250, a plurality of second trenches 280 are formed and surrounded by the second protrusion portions 160'.

As shown in FIG. 6H, there is a distance "de" between the center axis 160" of one second protrusion portion 160' and the center axis 140' of one metal grid 140 covered by the one second protrusion portion 160'. That is, the second protrusion portions 160' are shifted from the metal grids 140 by the distance "de".

In addition, the distance "de" between the center axis 160" of one second protrusion portion 160' and the center axis 140' of one metal grid 140 covered by the one second protrusion portion 160' within the edge region is greater than the distance between the center axis 160" of one second protrusion portion 160' and the center axis 140' of one metal grid 140 covered by the one second protrusion portion 160' within the middle region of the substrate 120.

In some embodiments, the distance "de" between the center axis 160" of one second protrusion portion 160' and the center axis 140' of one metal grid 140 covered by the one second protrusion portion 160' within the edge region is at least half of the width "W" of the one metal grid 140.

In some embodiments, the distance between the center axis 160" of one second protrusion portion 160' and the center axis 140' of one metal grid 140 is gradually increased from the center region to the edge region. That is, the exposed region size "S" of the top surface 140*a*" of the metal grid 140 is gradually increased from the center region to the edge region.

In some embodiments, the distance between the center axis 160" of one second protrusion portion 160' and the center axis 140' of one metal grid 140 is adjusted in accordance with the demands (such as receiving light with a specific incidence angle) of the products.

Next, color filters, such as red, green or blue color filter (not shown), are filled into the second trenches 280 which are surrounded by the second protrusion portions 160'. Therefore, the optical element is fabricated.

In the present invention, it is not required that a microlens (ML) structure be disposed over color filters. Light is conducted into photodiode (PD) areas through a wave-guiding element which is fabricated on metal grids. The present invention provides a two-stage etching process for fabricating a wave-guiding structure with dual grid (e.g., a low-refractive-index grid and a metal grid) shifting. An organic layer which is formed over the metal grids is etched by a first etching process to form a patterned organic layer. After the first etching process, the patterned organic layer still completely covers the metal grids to protect the metal grids from being damaged in a subsequent etching process. Various patterned mask layers with specific designs (e.g., size and location) and a combination thereof are then formed on the patterned organic layer. After a second etching process is performed, a wave-guiding structure with the dual grid shifting is thus obtained by properly controlling the etching time and the metal grids will not be damaged during the entire etching processes. Also, the organic layer remains on the substrate and the metal grids. In addition, the shifting distance between the dual grids is gradually increased from a center region to an edge region of the substrate to meet the requirements (such as receiving light with a specific incidence angle) of the related products.

The present invention also provides a method for fabricating a wave-guiding structure with the dual grid shifting in which adopts two organic layers. A first organic layer (refractive index: about 1.4 to about 1.55) is first formed on the metal grids. The first organic layer is used as a protection layer of the metal grids for a subsequent etching process. A second organic layer (refractive index: about 1.2 to about 1.45) is then formed on the first organic layer. The second organic layer is used to form the wave-guiding element. When a first etching process is performed using, for example, haloalkyl gas as an etching gas, the second organic layer is etched until the first organic layer is exposed. After the first etching process, the metal grids are still covered by the first organic layer without being exposed therefrom. The first organic layer is then removed by a second etching process using, for example, oxygen (i.e. a gas that will not damage the metal grid) as an etching gas. Using such a technique can effectively prevent damage to the metal grids during the etching process.

In addition, in some embodiments, although a part of the organic layer remains on the substrate, the thickness of the color filters can maintain the same height when the color filters are filled into the trenches surrounded by the organic layer, without affecting the optical performance, for example the QE profile.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an optical element, comprising:
   providing a substrate;
   forming a plurality of metal grids deposited on the substrate, wherein each metal grid has a top surface and a center axis;
   forming an organic layer deposited on the substrate and the plurality of metal grids;
   etching the organic layer to form a first patterned organic layer comprising a plurality of first protrusion portions and to form a plurality of first trenches surrounded by the first protrusion portions, wherein each first protrusion portion has a top surface and sidewalls, and each first trench has a bottom; and
   etching the first patterned organic layer with the first protrusion portions to form a second patterned organic layer comprising a plurality of second protrusion portions and to form a plurality of second trenches surrounded by the second protrusion portions, wherein each second protrusion portion having a center axis covers one metal grid,
   wherein there is a distance between the center axis of one second protrusion portion of the second patterned organic layer and the center axis of one metal grid covered by the one second protrusion portion of the second patterned organic layer.

2. The method for fabricating an optical element as claimed in claim 1, wherein the bottom of each first trench is over the top surface of each metal grid.

3. The method for fabricating an optical element as claimed in claim 2, wherein the step of etching the first patterned organic layer with the first protrusion portions to form the second patterned organic layer uses a mask layer which is disposed on a part of the top surface of each first protrusion portion of the first patterned organic layer as a mask.

4. The method for fabricating an optical element as claimed in claim 2, wherein the step of etching the first patterned organic layer with the first protrusion portions to form the second patterned organic layer uses a mask layer which is disposed on the top surface and a part of the sidewalls of each first protrusion portion of the first patterned organic layer as a mask.

5. The method for fabricating an optical element as claimed in claim 1, wherein the bottom of each first trench is under the top surface of each metal grid.

6. The method for fabricating an optical element as claimed in claim 5, wherein the step of etching the first patterned organic layer with the first protrusion portions to form the second patterned organic layer uses a mask layer which is disposed on a part of the top surface of each first protrusion portion of the first patterned organic layer and filled into the plurality of first trenches as a mask.

7. The method for fabricating an optical element as claimed in claim 1, wherein the step of etching the first patterned organic layer with the first protrusion portions to form the second patterned organic layer further comprises forming a plurality of extension portions covering the metal grids and connecting to adjacent second protrusion portions of the second patterned organic layer.

8. The method for fabricating an optical element as claimed in claim 1, wherein the organic layer has a refractive index which is in a range from about 1.2 to about 1.45.

9. The method for fabricating an optical element as claimed in claim 1, wherein the organic layer comprises a first portion having a refractive index from about 1.4 to about 1.55 and a second portion having a refractive index from about 1.2 to about 1.45, the second portion being above the first portion, and the first portion covering the top surface of each metal grid.

10. The method for fabricating an optical element as claimed in claim 9, wherein the step of etching the organic layer to form the first patterned organic layer comprises etching the second portion of the organic layer to form the first patterned organic layer comprising the plurality of first protrusion portions and the first portion of the organic layer, wherein the plurality of first trenches are surrounded by the first protrusion portions, and the bottom of each first trench is over the top surface of each metal grid.

11. The method for fabricating an optical element as claimed in claim 10, wherein the step of etching the first patterned organic layer with the first protrusion portions to form the second patterned organic layer comprises etching the first portion of the organic layer to form the plurality of second protrusion portions and the plurality of second trenches surrounded by the second protrusion portions.

12. The method for fabricating an optical element as claimed in claim 11, wherein after the step of etching the first patterned organic layer with the first protrusion portions to form the second patterned organic layer, a part of the first portion of the organic layer is left between each second protrusion portion and each metal grid.

13. The method for fabricating an optical element as claimed in claim 10, wherein the step of etching the first patterned organic layer with the first protrusion portions to form the second patterned organic layer uses a mask layer which is disposed on the top surface of each first protrusion portion of the first patterned organic layer as a mask.

14. The method for fabricating an optical element as claimed in claim 10, wherein the step of etching the first patterned organic layer with the first protrusion portions to form the second patterned organic layer uses a mask layer which is disposed on the top surface and a part of the sidewalls of each first protrusion portion of the first patterned organic layer as a mask.

15. The method for fabricating an optical element as claimed in claim 1, wherein the step of etching the organic layer to form the first patterned organic layer uses haloalkyl gas as an etching gas.

16. The method for fabricating an optical element as claimed in claim 1, wherein the step of etching the first patterned organic layer with the first protrusion portions to form the second patterned organic layer uses haloalkyl gas, oxygen, carbon dioxide or nitrogen as an etching gas.

17. The method for fabricating an optical element as claimed in claim 1, further comprising filling color filters into the second trenches.

18. An optical element, comprising:
   a substrate comprising a center region, a middle region and an edge region, wherein the middle region is located between the center region and the edge region;
   a plurality of metal grids formed on the substrate located within the center region, the middle region and the edge region respectively, wherein each metal grid has a width and a center axis; and
   an organic layer formed on the substrate and the plurality of metal grids,
   wherein the organic layer within the center region comprises a plurality of protrusion portions and a plurality of extension portions, wherein each extension portion is connected to adjacent protrusion portions, and each protrusion portion has a center axis, wherein each metal grid is covered by one protrusion portion of the organic layer within the center region, and there is no distance between the center axis of one protrusion portion of the organic layer and the center axis of one metal grid covered by the one protrusion portion of the organic layer within the center region, and
   wherein the organic layer within the middle region comprises a plurality of protrusion portions and a plurality of extension portions, wherein each extension portion is connected to adjacent protrusion portions, and each protrusion portion has a center axis, wherein each metal grid is simultaneously covered by one protrusion portion and one extension portion of the organic layer within the middle region, and there is a distance between the center axis of one protrusion portion of the organic layer and the center axis of one metal grid covered by the one protrusion portion of the organic layer within the middle region, and
   wherein the organic layer within the edge region comprises a plurality of protrusion portions and a plurality of extension portions, wherein each extension portion is connected to adjacent protrusion portions, and each protrusion portion has a center axis, wherein each metal grid is simultaneously covered by one protrusion portion and one extension portion of the organic layer within the edge region, and there is a distance between the center axis of one protrusion portion of the organic layer and the center axis of one metal grid covered by the one protrusion portion of the organic layer within the edge region, and
   wherein the distance between the center axis of one protrusion portion of the organic layer and the center axis of one metal grid covered by the one protrusion portion of the organic layer within the edge region is greater than that within the middle region.

19. The optical element as claimed in claim 18, wherein the organic layer has a refractive index which is in a range from about 1.2 to about 1.45, and each extension portion of the organic layer has a thickness which is in a range from about 0.05 µm to about 0.2 µm.

20. The optical element as claimed in claim 18, wherein the distance between the center axis of one protrusion portion of the organic layer and the center axis of one metal grid covered by the one protrusion portion of the organic layer is at least half of the width of the one metal grid within the edge region.

* * * * *